US012684707B2

(12) United States Patent
Ryu et al.

(10) Patent No.: US 12,684,707 B2
(45) Date of Patent: Jul. 14, 2026

(54) WATERPROOF MEMBRANE ASSEMBLY AND ELECTRONIC DEVICE INCLUDING THE SAME

(71) Applicant: Samsung Electronics Co., Ltd., Suwon-si (KR)

(72) Inventors: Heejun Ryu, Suwon-si (KR); Sungkeun Koo, Suwon-si (KR); Dongju Yeon, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/632,935

(22) Filed: Apr. 11, 2024

(65) Prior Publication Data

US 2024/0349432 A1     Oct. 17, 2024

Related U.S. Application Data

(63) Continuation of application No. PCT/KR2024/004875, filed on Apr. 11, 2024.

(30) Foreign Application Priority Data

Apr. 11, 2023    (KR) ........................ 10-2023-0047405
Apr. 28, 2023    (KR) ........................ 10-2023-0056624

(51) Int. Cl.
*G06F 1/16*          (2006.01)
*H05K 1/181*        (2026.01)
(Continued)

(52) U.S. Cl.
CPC ........... *H05K 5/0056* (2013.01); *H05K 1/181* (2013.01); *H05K 2201/10083* (2013.01)

(58) Field of Classification Search
CPC .. H05K 5/0056; H05K 5/0047; H05K 5/0095; H05K 1/181; H05K 1/18; H05K 5/0214; H05K 5/064; H05K 5/065
See application file for complete search history.

(56) References Cited

U.S. PATENT DOCUMENTS 6,512,834  B1    1/2003  Banter et al.
7,110,553  B1    9/2006  Julstrom et al.
(Continued)

FOREIGN PATENT DOCUMENTS

CN        111200681 A     5/2020
CN        112492489 A     3/2021
(Continued)

OTHER PUBLICATIONS

European Search Report for European Patent Application No. 24789057.7 dated May 7, 2026.

*Primary Examiner* — Anthony M Haughton
(74) *Attorney, Agent, or Firm* — CANTOR COLBURN LLP

(57)          ABSTRACT

An electronic device includes a plate including an inner surface exposed to an internal space of the electronic device, a circuit board facing the inner surface of the plate, the circuit board including a first surface and a second surface which is opposite to the first surface of the circuit board and faces the inner surface of the plate, an electronic component on the first surface of the circuit board, a sealing member on the second surface of the circuit board, and a waterproof member which is on the inner surface of the plate and is configured to be assembled with the sealing member. The sealing member assembled with the waterproof member includes the sealing member in contact with the waterproof member.

20 Claims, 22 Drawing Sheets

(51) Int. Cl.
  *H05K 5/00*          (2025.01)
  *H05K 7/00*          (2006.01)

(56)          References Cited

U.S. PATENT DOCUMENTS

| | | | | |
|---|---|---|---|---|
| 8,417,298 B2 * | 4/2013 | Mittleman | .......... | H04M 1/0202 |
| | | | | 455/575.1 |
| 9,529,387 B2 * | 12/2016 | Carnevali | ............ | H04B 1/3888 |
| 9,750,152 B2 * | 8/2017 | Jarvis | .................. | H01R 43/205 |
| 11,689,834 B2 * | 6/2023 | Oster | .................. | H01Q 9/0407 |
| | | | | 343/702 |
| 2012/0118773 A1 * | 5/2012 | Rayner | .................... | H05K 5/15 |
| | | | | 206/320 |
| 2016/0044816 A1 * | 2/2016 | Jarvis | ..................... | H01H 23/04 |
| | | | | 361/767 |
| 2017/0372123 A1 * | 12/2017 | Kim | ..................... | G06F 3/0412 |
| 2018/0035203 A1 | 2/2018 | Hirai et al. | | |
| 2018/0242079 A1 | 8/2018 | Seo | | |
| 2019/0072903 A1 | 3/2019 | Park et al. | | |
| 2019/0255801 A1 | 8/2019 | Seo | | |
| 2020/0178411 A1 * | 6/2020 | Pham | ..................... | H04M 1/18 |
| 2021/0088979 A1 * | 3/2021 | Son | ........................ | H04R 1/028 |
| 2021/0144242 A1 | 5/2021 | Choi et al. | | |
| 2021/0314685 A1 * | 10/2021 | Oster | .................... | H01Q 21/28 |
| 2022/0150613 A1 | 5/2022 | Cho et al. | | |
| 2022/0191352 A1 | 6/2022 | Park et al. | | |
| 2022/0224783 A1 * | 7/2022 | Lee | ..................... | H04M 1/0202 |
| 2022/0286543 A1 * | 9/2022 | Hale | ................... | H04M 1/0249 |
| 2023/0052402 A1 * | 2/2023 | Choi | .................... | H05K 5/0217 |
| 2023/0071540 A1 * | 3/2023 | Kim | ..................... | G06F 1/1652 |
| 2023/0254628 A1 | 8/2023 | Kim et al. | | |
| 2025/0098092 A1 | 3/2025 | Lin et al. | | |

FOREIGN PATENT DOCUMENTS

| | | |
|---|---|---|
| CN | 213906864 U | 8/2021 |
| CN | 115845473 A | 3/2023 |
| EP | 4124004 A1 | 1/2023 |
| JP | 2008199225 A | 8/2008 |
| JP | 2009010234 A | 1/2009 |
| JP | 2011023786 A | 2/2011 |
| JP | 2016158222 A | 9/2016 |
| JP | 2019149698 A | 9/2019 |
| KR | 20170008436 A | 1/2017 |
| KR | 20170023390 A | 3/2017 |
| KR | 20180006046 A | 1/2018 |
| KR | 20190026461 A | 3/2019 |
| KR | 20200109903 A | 9/2020 |
| KR | 20220101538 A | 7/2022 |
| KR | 20220101834 A | 7/2022 |
| KR | 20230046035 A | 4/2023 |

* cited by examiner

500

M1

HS

M2

HS

WATERPROOF MEMBRANE ASSEMBLY AND ELECTRONIC DEVICE INCLUDING THE SAME

CROSS-REFERENCE TO RELATED APPLICATIONS

This application is a continuation application of International Application No. PCT/KR2024/004875 designating the United States, filed on Apr. 11, 2024, in the Korean Intellectual Property Receiving Office and claiming priority to Korean Patent Application No. 10-2023-0047405, filed on Apr. 11, 2023 and Korean Patent Application No. 10-2023-0056624, filed on Apr. 28, 2023, in the Korean Intellectual Property Office, the disclosures of which are incorporated by reference herein in their entireties.

BACKGROUND

(1) Field

Embodiments of the disclosure relate to a microphone waterproof membrane assembly for acoustic sealing of a microphone and an electronic device including the same.

(2) Description of the Related Art

Thanks to the development of information and communication technology and semiconductor technology, various functions are integrated in a single portable electronic device. For example, an electronic device may implement an entertainment function such as games, a multimedia function such as music and video playback, a communication and security function for mobile banking, a camera function for taking an image/video, schedule management, and an electronic wallet function, in addition to a communication function. Such electronic devices are being miniaturized so that users may carry them conveniently.

The above information is presented as related art only to assist with an understanding of the disclosure. No determination has been made, and no assertion is made, as to whether any of the above might be applicable as prior art with regard to the disclosure.

SUMMARY

According to an embodiment of the disclosure, an electronic device includes a plate surrounding at least a portion of an internal space of the electronic device, a printed circuit board, an electronic component disposed on a first surface of the printed circuit board, a sealing member disposed on a second surface of the printed circuit board, and a waterproof member disposed on an inner surface of the plate forming the internal space and configured to contact the sealing member.

According to an embodiment of the disclosure, an electronic device includes a plate including a first surface facing in a first direction, a second surface facing in a second direction opposite to the first direction, and a third surface facing in a third direction different from the first direction and the second direction, a printed circuit board configured to be disposed facing the second surface of the plate, an audio module disposed on a first surface of the printed circuit board, a sealing member disposed on a second surface of the printed circuit board, and a waterproof member disposed on a seating surface formed on the second surface of the plate, and configured to contact the sealing member. The sealing member and the waterproof member are configured to be at least partially accommodated in a recess formed by the seating surface of the plate and the printed circuit board.

According to an embodiment of the disclosure, an electronic device includes a plate including a first surface facing in a first direction, a second surface facing in a second direction opposite to the first direction, and a third surface facing in a third direction different from the first direction and the second direction, a printed circuit board configured to be disposed facing the second surface of the plate, an audio module disposed on a first surface of the printed circuit board, and a waterproof membrane assembly configured to be at least partially accommodated in a recess formed on the plate. The waterproof membrane assembly includes a first sub-assembly disposed on a second surface of the printed circuit board and including a first adhesive member and a first elastic member, a second sub-assembly disposed on a seating surface formed on the second surface of the plate and including a second adhesive member, a second elastic member, and a membrane, and a reinforcement member exposed on a surface of one of the first sub-assembly and the second sub-assembly.

BRIEF DESCRIPTION OF THE DRAWINGS

The above or other aspects, features and/or advantages of an embodiment of the disclosure will be more apparent from the following description taken in conjunction with the accompanying drawings.

Like reference numerals may be assigned to like components, configuration and/or structures throughout the accompanying drawings.

DETAILED DESCRIPTION

Figure 1:
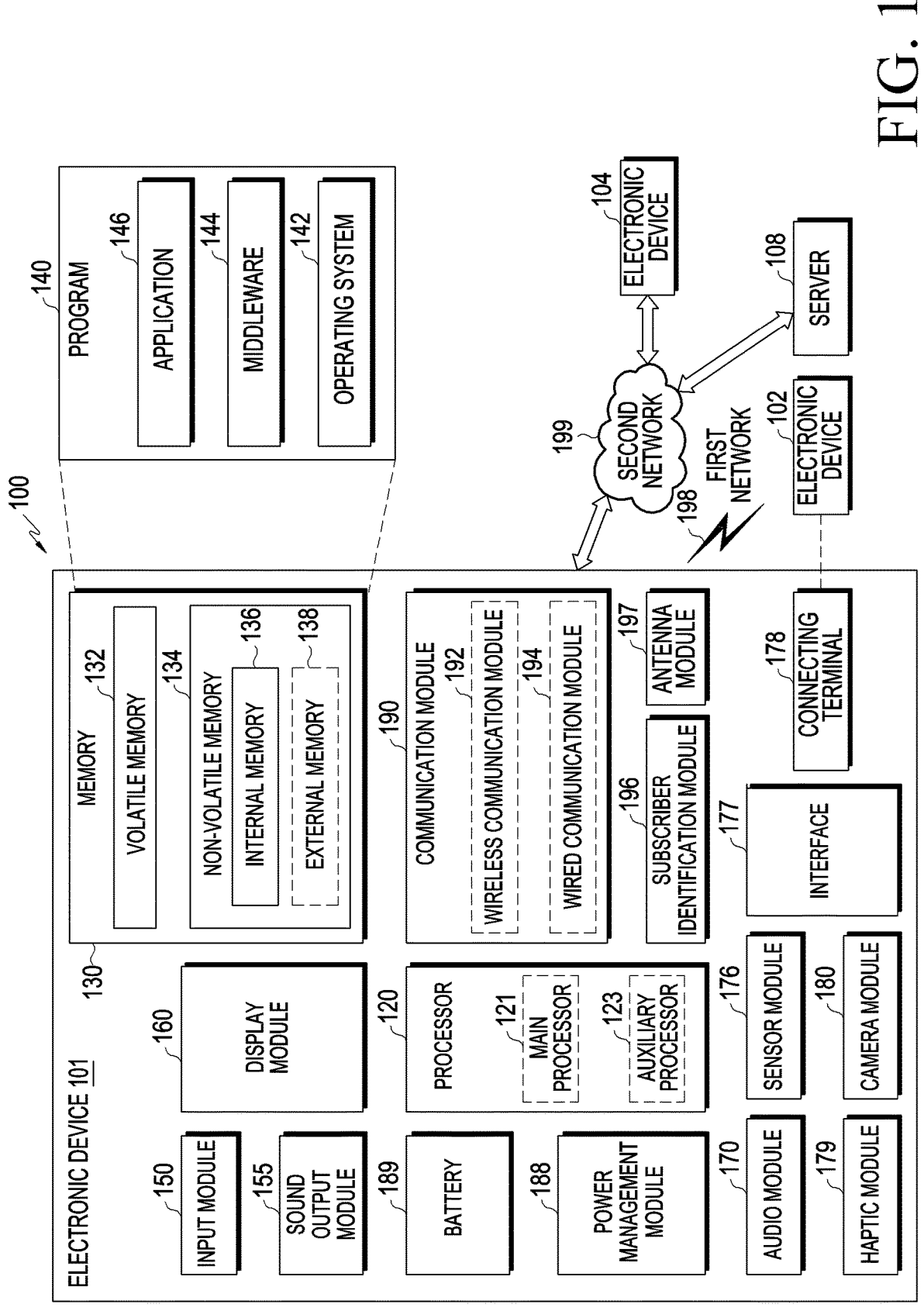
FIG. 1 is a block diagram illustrating an electronic device in a network environment according to an embodiment.

An electronic device (e.g., a portable terminal) may include a microphone as an audio module to obtain sound from the outside of the electronic device. According to an embodiment, the microphone may be disposed on a plate (e.g., a front plate) of a housing. For example, the plate may have a first surface facing the outside of the electronic device, on which a display is disposed, and a second surface which is an inner surface forming an internal space of the electronic device and on which the microphone may be disposed. The microphone may obtain sound from the outside of the electronic device through a microphone hole formed (or provided) in the housing. The microphone hole may be connected to a path (e.g., an auditory path) extending toward the internal space of the electronic device, such that the inner space is connected to outside of the electronic device by the microphone hole and the path.

According to an embodiment, a printed circuit board (PCB) may be disposed in the internal space of the electronic device. The PCB may include a first surface and a second surface which faces in a direction opposite to the first surface, and various electronic components may be disposed on the first surface and/or the second surface. For example, the PCB may be disposed at a position adjacent to an end of the path, with the microphone disposed on the first surface and the second surface which faces the end of the path. A recess may be formed between the second surface of the PCB and the path. A waterproof membrane assembly (e.g., a microphone waterproof membrane assembly) that prevents a fluid (e.g., a liquid) or a foreign material other than air from entering the microphone may be accommodated in the recess.

According to some embodiments, the PCB with the microphone disposed thereon may be assembled to the waterproof membrane assembly accommodated on the plate. During the PCB assembly process, the waterproof membrane assembly may be damaged. For example, when the PCB is assembled, the waterproof membrane assembly may be torn or pushed off, resulting in a poor assembly. Moreover, when a seating surface of the plate on which the waterproof membrane assembly is mounted is machined, there may be a tolerance (e.g., a design and/or machining tolerance of a mold) for the depth of the seating surface, and when the waterproof membrane assembly is fabricated, there may be a tolerance (e.g., a material tolerance) for the thickness of the water membrane assembly. The compressive force of the waterproof membrane assembly may have a great deviation according to these tolerances. When the compressive force of the waterproof membrane assembly is small, a problem such as sound leakage may occur, or when the compressive force is large, a problem such as damage (e.g., cracking) to a solder or metal pad formed when the microphone is disposed on the PCB may occur.

Various embodiments of the disclosure may provide an electronic device which may provide a waterproof membrane assemble having a small height and formed with a compressive force distributed as much as possible, to thereby prevent damage to a microphone and/or the waterproof membrane assembly, while maintaining the performance of the microphone constant.

FIG. 1 is a block diagram illustrating an electronic device 101 in a network environment 100 according to embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the strength of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a PCB). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a PCB, a RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IOT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
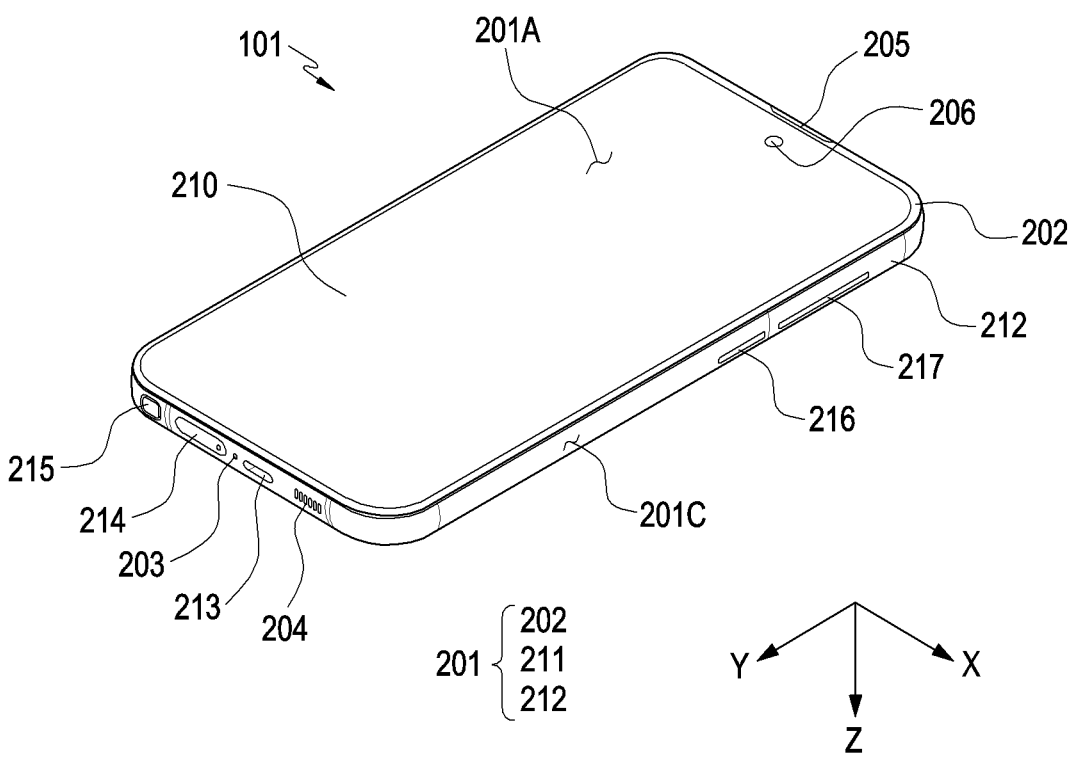
FIG. 2 is a front perspective view illustrating an electronic device according to an embodiment.
Figure 3:
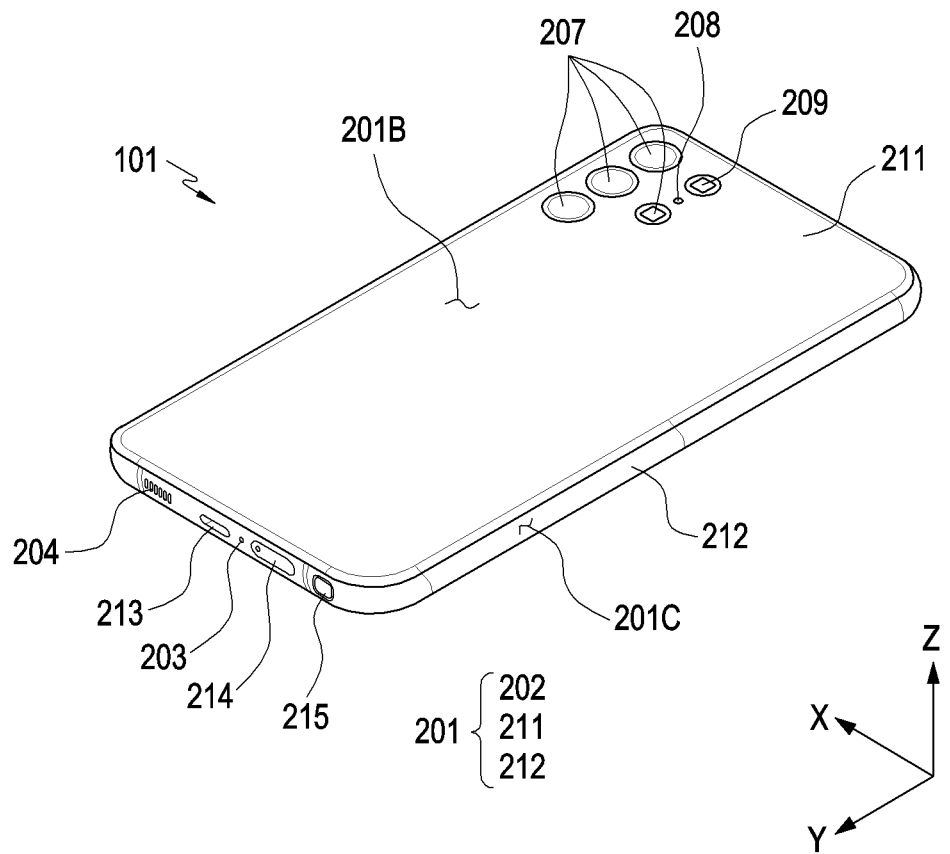
FIG. 3 is a rear perspective view illustrating an electronic device according to an embodiment.

FIG. 2 is a front perspective view illustrating an electronic device according to an embodiment. FIG. 3 is a rear perspective view illustrating an electronic device according to an embodiment.

In the following detailed description of FIGS. 2 and 3, a length direction, a width direction, and/or a height direction (thickness direction) of the electronic device 101 may be defined as a 'Y-axis direction', an 'X-axis direction', and/or a 'Z-axis direction', respectively. In the following detailed description, a length direction, a width direction, and/or a height direction (or thickness direction) may refer to the length direction, width direction, and/or height direction (or thickness direction) of the electronic device 101. In some embodiments, regarding a direction which a component faces, a 'negative sign/positive sign (−/+)' may be referred to together with the Cartesian coordinate system illustrated in the drawings. For example, referring to FIG. 4, the front surface of the electronic device 101 may be defined as a 'surface facing in a −Z-axis direction', and the rear surface thereof may be defined as a 'surface facing in a +Z-axis direction'. According to an embodiment, an arrangement relationship in the height direction between one component or another, that is, a reference for above/below (on/under) may be based on the +Z-axis direction/−Z-axis direction. That is, when it is said that a component is disposed above (on) another component, this may mean that the component is disposed in the +Z-axis direction with respect to the other component, and when it is said that a component is disposed below (under) another component, this may mean that the component is disposed in the −Z-axis direction with respect to the other component.

Meanwhile, it is to be noted that when a component is disposed above (on) or below (under) another component, this does not mean that the entirety of the component is disposed above (on) or below (under) the entirety of the other component. For example, it is to be noted that although a portion of a component may be disposed above (on) a portion of another component, another portion of the component may be disposed below (under) another portion of the other component. In the following description, when it is said that a component is overlapped (or stacked) with another component, it is to be noted that the description of the arrangement relationship in the height direction is applicable. When the 'negative sign/positive sign (−/+)' is not specified in describing a direction, it may be interpreted as facing in a +direction unless otherwise defined. For example, a 'Z-axis direction' may be interpreted as facing the +Z-axis direction, an 'X-axis direction' may be interpreted as facing the +X-axis direction, and a 'Y-axis direction' may be interpreted as facing the +Y-axis direction. In describing a direction, facing any one of the three axes of the Cartesian coordinate system may include facing a direction parallel to the axis. It is to be noted that this is based on the Cartesian coordinate system depicted in the drawings for simplicity of description and that the description of these directions or components does not limit various embodiments of the disclosure.

Referring to FIGS. 2 and 3, the electronic device 101 according to an embodiment may include a housing 201 including a front surface 201A, a rear surface 201B, and side surfaces 201C surrounding a space defined between the front surface 201A and the rear surface 201B. In another embodiment (not shown), the housing 201 may refer to a structure which forms the front surface 201A of FIG. 2, the rear surface 201B of FIG. 3, and some of the side surfaces 201C.

According to an embodiment, at least a portion of the front surface 201A may be formed by a front plate 202 (e.g., a glass plate or polymer plate including various coating layers) which is at least partially substantially transparent. The rear surface 201B may be formed by a rear plate 211. The rear plate 211 may be formed of, for example, glass, ceramic, a polymer, a metal (e.g., aluminum, stainless steel (STS), or magnesium), or a combination of at least two of these materials. The side surfaces 201C may be coupled to the front plate 202 and the rear plate 211 and formed by a side bezel structure (or "side member") 212 including a metal and/or a polymer.

In some embodiments, the front plate 202 and the side bezel structure 212 may be integrally formed into one body and include the same material. Alternatively, the rear plate 211 and the side bezel structure 212 may be integrally formed into one body and include the same material (e.g., glass, a metallic material such as aluminum, or ceramic). According to another embodiment, the front surface 201A and/or the front plate 202 may be interpreted as a portion of a display 210. According to an embodiment, the housing 201 may include the front plate 202 together with the rear plate 211.

According to an embodiment, the electronic device 101 may include at least one of the display 210, audio modules 203, 204, and 205 (e.g., the audio module 170 in FIG. 7), a sensor module (e.g., the sensor module 176 in FIG. 1), camera modules 206 and 207 (e.g., the camera module 180 in FIG. 1), key input devices 216 and 217 (e.g., the input module 150 in FIG. 1), and connector holes 213 and 214 (e.g., the connecting terminal 178 in FIG. 1). In some embodiments, the electronic device 101 may not be provided with at least one (e.g., the connector hole 214) of the components or additionally include other components.

According to an embodiment, the display 210 may be visually exposed, for example, through a substantial portion of the front plate 202. In some embodiments, at least a portion of the display 210 may be exposed through the front plate 202 forming the front surface 201A. According to an embodiment, the display 210 may be a flexible display or a foldable display.

According to an embodiment, a surface (or the front plate 202) of the housing 201 may include (or define) a screen display area formed by the visual exposure of the display 210. For example, the screen display area may include the front surface 201A.

In another embodiment (not shown), the electronic device 101 may include a recess or an opening formed on a portion of the screen display area (e.g., the front surface 201A) of the display 210, and include at least one of the audio module 205, the sensor module (not shown), a light emitting element (not shown), and the camera module 205, which is aligned with the recess or the opening. In another embodiment (not shown), at least one of the audio module 205, the sensor module (not shown), the camera module 206, a fingerprint sensor (not shown), and the light emitting element (not shown) may be included on the rear surface of the screen display area of the display 210.

In another embodiment (not shown), the display 210 may be coupled to or disposed adjacent to a touch sensing circuit, a pressure sensor capable of measuring the intensity (pressure) of a touch, and/or a digitizer that detects a pen input device (e.g., a magnetic field-based stylus pen 215).

In some embodiments, at least some of the key input devices 216 and 217 may be disposed on the side bezel structure 212.

According to an embodiment, the audio modules 203, 204 and 205 may include a microphone hole 203 and speaker holes 204 and 205. A microphone for obtaining external sound may be disposed in the microphone hole 203, and in some embodiments, a plurality of microphones may be disposed to detect the direction of sound. The speaker holes 204 and 205 may include an external speaker hole 204 and a receiver hole 205 for audio calls. In some embodiments, the speaker holes 204 and 205 and the microphone hole 203 may be implemented as a single hole, or a speaker (e.g., a piezo speaker) may be included without the speaker holes 204 and 205.

According to an embodiment, the sensor module (not shown) may generate an electrical signal or data value corresponding to, for example, an internal operating state of the electronic device 101 or an external environmental state. The sensor module (not shown) may include, for example, a first sensor module (not shown) (e.g., a proximity sensor) and/or a second sensor module (not shown) (e.g., a fingerprint sensor), disposed on the front surface 201A of the housing 201, and/or a third sensor module (not shown) (e.g., a hear rate monitor (HRM) sensor) and/or a fourth sensor module (not shown) (e.g., a fingerprint sensor) disposed on the rear surface 201B of the housing 201. In some embodiments (not shown), a fingerprint sensor may be disposed on the rear surface 201B as well as on the front surface 201A (e.g., the display 210) of the housing 201. The electronic device 101 may further include a sensor module which is not shown, for example, at least one of a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and an illuminance sensor (not shown).

According to an embodiment, the camera modules 206 and 207 may include, for example, a front camera module 206 disposed on the front surface 201A of the electronic device 101, and a rear camera module 207, a flash 208, and an IR sensor 209 disposed on the rear surface 201B of the electronic device 101. The camera modules 206 and 207 may include one or more lenses, an image sensor, and/or an image signal processor. The flash 208 may include, for example, a light emitting diode (LED) or a xenon lamp. In some embodiments, two or more lenses (an IR camera, a wide-angle lens, and a telephoto lens) and image sensors may be arranged on one surface of the electronic device 101.

According to an embodiment, the key input devices 216 and 217 may be disposed on a side surface 201C of the housing 201. In another embodiment, the electronic device 101 may not include some or any of the above key input devices 216 and 217, and the key input devices 216 and 217 which are not included may be implemented in other forms such as soft keys on the display 210.

According to an embodiment, the light emitting element (not shown) may be disposed, for example, on the front surface 201A of the housing 201. The light emitting element (not shown) may provide, for example, state information about the electronic device 101 in the form of light. In another embodiment, the light emitting element (not shown) may provide, for example, a light source operating in conjunction with an operation of the front camera module 206. The light emitting element (not shown) may include, for example, an LED, an IR LED, and/or a xenon lamp.

According to an embodiment, the connector holes 213 and 214 may include a first connector hole 213 which may accommodate a connector (e.g., a universal serial bus (USB) connector) for transmitting and receiving power and/or data to and from an external electronic device and a connector (e.g., an earphone jack) for transmitting and receiving an audio signal to and from an external electronic device, and/or a second connector hole 214 which may accommodate a storage device (e.g., a subscriber identification module (SIM) card). According to an embodiment, the first connector hole 213 and/or the second connector hole 214 may be omitted.

The pen input device 215 (e.g., a stylus pen) may be inserted into or removed from the housing 201 through a hole formed on a side surface of the housing 201, and include a button which facilitates the insertion and removal. The pen input device 215 may have a separate resonant circuit built therein to operate in conjunction with an electromagnetic induction panel (e.g., a digitizer) included in the electronic device 101. The pen input device 215 may operate in an electro-magnetic resonance (EMR) scheme, an active electrical stylus (AES) scheme, and an electric coupled resonance (ECR) scheme.

Figure 4:
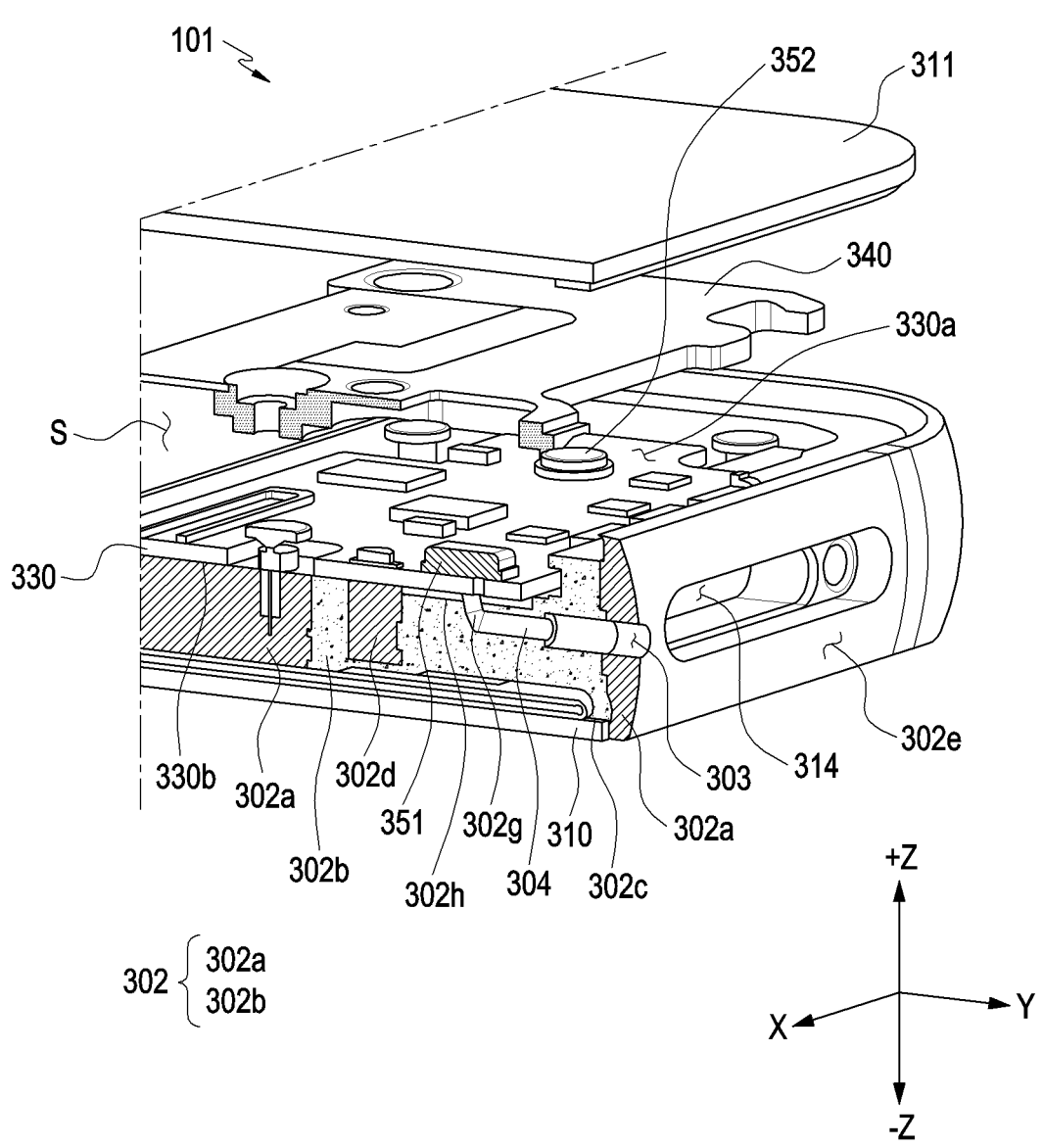
FIG. 4 is an exploded enlarged perspective view illustrating an end portion of an electronic device according to an embodiment.

FIG. 4 is an exploded perspective view illustrating an electronic device according to an embodiment. FIG. 4 illustrates an enlarged exploded view at an end portion of the electronic device.

Referring to FIG. 4, the electronic device 101 according to an embodiment may include a plate 302, a display 310 as a display panel, and a PCB 330 as a circuit board. Some of the components of the electronic device 101 illustrated in FIG. 4 may be the same as or similar to the components of the electronic device 101 illustrated in FIGS. 1 to 3, and a redundant description will be avoided herein.

The plate 302 may be configured to surround at least a portion of an internal space S of the electronic device 101. According to an embodiment, the plate 302 may include a first surface 302c facing in a first direction (e.g., the −Z-axis direction), a second surface 302d facing in a second direction (e.g., the +Z-axis direction) opposite to the first direction, and a third surface 302e facing in a third direction (e.g., the Y-axis direction) different from the first direction and the second direction. The internal space S may be formed or bounded by the second surface 302*d* of the plate 302.

According to an embodiment, the plate 302 may be included in the housing 201 described before with reference to FIG. 2. For example, the plate 302 may correspond to the front plate 202 described before with reference to FIG. 2. The first surface 302*c* of the plate 302 may correspond to the front surface 201A described before with reference to FIG. 2.

According to an embodiment, the plate 302 may be a structure into which the front plate 202 and the side bezel structure 212 are integrated as described before with reference to FIG. 2, and include a portion corresponding to a side surface of the exterior of the electronic device 101. For example, the third surface 302*e* of the plate 302 may correspond to a side surface 201C of the electronic device 101 illustrated in FIG. 2.

In addition to the plate 302, the electronic device 101 may further include another plate (e.g., a rear plate 311) coupled to the plate 302. According to an embodiment, the plate 302 and the rear plate 311 may be disposed to face each other and form the internal space S of the electronic device 101. For example, the internal space S may be understood as a specific space or volume in which components (e.g., electronic components 351 and 352, the PCB 330, a bracket 340, and/or other components and structures) included in the electronic device 101 may be accommodated.

According to an embodiment, when the plate 302 is formed in a roughly rectangular shape as viewed from above (e.g., viewed in the –Z-axis direction), the third surface 302*c* may include four surfaces facing in four different directions in correspondence with edge shapes of the plate 302. For example, the third surface 302*e* may include a surface facing in a direction parallel to the Y-axis direction as well as a surface facing in a direction parallel to the X axis.

According to an embodiment, the plate 302 may include a first portion 302*a* including a conductive material and a second portion 302*b* including a non-conductive material. For example, the first portion 302*a* may include a metallic material such as stainless steel (SUS), aluminum (Al), titanium (Ti), copper (Cu), and/or magnesium (Mg), and the second portion 302*b* may include an insulating material such as a polymer. There may be a plurality of first portions 302*a*, which may be insulated from each other according to embodiments. The first portions 302*a* may be used as antennas according to embodiments. According to an embodiment, a first portion 302*a* may be electrically isolated from the other first portions 302*a* by the second portions 302*b* and/or at least one slit in order to use the first portion 302*a* as an antenna. According to an embodiment, the second portions 302*b* may be disposed adjacent to the first portions 302*a* by insert injection.

The display 310 may be disposed on the first surface 302*c* of the plate 302. According to an embodiment, the display 310 may be visually exposed, for example, through a substantial portion of the plate 302. According to an embodiment, at least a portion of the display 310 may be exposed through the plate 302 forming the first surface 302*c*. According to an embodiment, the display 310 may be a flexible display or a foldable display. According to an embodiment, the plate 302 may include a screen display area formed by visual exposure of the display 310.

The electronic device 101 may include the PCB 330 in the internal space S. According to an embodiment, the electronic device 101 may include the PCB 330 disposed on one surface of the plate 302. For example, the PCB 330 may be disposed on the second surface 302*d* of the plate 302. The PCB 330 may include a first surface 330*a* and a second surface 330*b* which face in opposite directions, and when the PCB 330 is disposed on the second surface 302*d* of the plate 302, the second surface 330*b* of the PCB 330 may face the second surface 302*d* of the plate 302.

Components (e.g., the electronic components 351 and 352) and connectors for implementing various functions of the electronic device 101 may be mounted on the PCB 330. The electronic components 351 and 352 may be electrically connected to the PCB 330. According to an embodiment, the electronic device 101 may further include another PCB (e.g., a PCB 320 described later with reference to FIG. 10A) or the bracket 340, in addition to the PCB 330. According to an embodiment, the PCB 320 described later with reference to FIG. 10A may be used as a main PCB of the electronic device 101, and the PCB 330 may be used as a sub-PCB of the electronic device 101, to which the disclosure is not necessarily limited. According to an embodiment, although the PCB 330 may include a rigid material, it may also be provided as a flexible PCB (FPCB) formed by including a flexible material, according to embodiments.

The plate 302 may include a vent hole 302*f*. The vent hole 302*f* may penetrate at least a portion of the plate 302 such that the outside of the electronic device 101 and the internal space S of the electronic device 101 are in acoustic communication. Acoustic communication between the outside of the electronic device 101 and the internal space S of the electronic device 101 may mean that as air flows between the outside of the electronic device 101 and the internal space S of the electronic device 101 through the vent hole 302*f*, sound is transmitted from the outside of the electronic device 101 to the inside of the electronic device 101 or from the inside of the electronic device 101 to the outside of the electronic device 101. In other words, the vent hole 302*f* may correspond to a type of sound path as an audio signal flow path. According to an embodiment, the vent hole 302*f* of the disclosure may be a hole corresponding to the audio module 203 of FIG. 2, for example, a microphone. A connector hole 314 may be formed at a position adjacent to the vent hole 302*f*.

Sound from the outside of the electronic device 101 may be transmitted to the electronic component 351 (an audio module, for example, a 'microphone') disposed within the electronic device 101 through the vent hole 302*f*. According to an embodiment, the vent hole 302*f* may extend from a first opening 303 formed on the third surface 302*e* of the plate 302 toward the second surface 302*d* of the plate 302. According to an embodiment, the first opening 303 may be formed at one end of the vent hole 302*f*, and a second opening 302*g* may be formed at the other end of the vent hole 302*f*.

A waterproof structure (e.g., a waterproof structure 400 of FIG. 5) may be disposed at a position adjacent to the second opening 302*g* of the vent hole 302*f*. The waterproof structure may allow air to flow but prevent and/or reduce the entry of a liquid (e.g., water) and/or a foreign material (e.g., dust). The second opening 302*g* of the vent hole 302*f* may communicate with the internal space S of the electronic device 101, and sound passing through the vent hole 302*f* may be transmitted to the electronic component 351 (the audio module, for example, the 'microphone') disposed at a position close to the second opening 302*g* of the vent hole 302*f*. The first opening 303 and the second opening 302*g* may correspond to one end and the other end of the vent hole 302*f*, and the position, size, and/or shape of the vent hole 302*f* may vary depending on the positions, sizes, and/or shapes of the first opening 303 and the second opening 302*g*.

A recess may be formed between the other end of the vent hole 302f, that is, the second opening 302g, and the PCB 330. The recess may refer to a portion recessed to a specific depth in the first direction (the –Z-axis direction) from the second surface 302d of the plate 302 which faces the second surface 330b of the PCB 330. The recess may be defined by a seating surface 302h stepped with respect to the second surface 302d by a predetermined depth. The electronic device 101 may include the waterproof structure disposed in the recess to prevent and/or reduce a liquid from the outside of the electronic device from entering the internal space S through the vent hole 302f.

FIGS. 5A-5D are diagrams illustrating coupling of a PCB to a plate according to an embodiment.

According to an embodiment, the plate 302 may be integrally formed with a side bezel structure (e.g., the side bezel structure 212 of FIG. 2) to include a side surface (e.g., the third surface 302c) facing outward from the electronic device. According to an embodiment, the inner surface of the plate 302 which forms the internal space of the electronic device may be provided with an irregularity 302i, such as a groove, a sink structure, or the like. The irregularity 302i may be unintentionally provided in a process of manufacturing the plate 302 and/or assembling the electronic device 101, or may be intentionally provided in order to perform an operation such as anodizing.

According to an embodiment, to dispose the PCB 330 on one surface (e.g., the second surface 302d) of the plate 302 of the electronic device 101, the PCB 330 may be assembled by avoiding the irregularity 302i. For example, with the waterproof structure 400 positioned on the seating surface 302h of the plate 302, the second surface 330b of the PCB 330 may be brought into contact with the second surface 302d of the plate 302. In a specific example, the PCB 330 may be assembled not to interfere with the irregularity 302i by positioning a first end of the PCB 330 close to the second surface 302d of the plate 302 (FIG. 5A), tilting the PCB 330 at a predetermined angle with respect to the second surface 302d of the plate 302 (FIG. 5B), and rotating the second surface 330b of the PCB 330 to be parallel to the second surface 302d of the plate 302 (FIGS. 5C to 5D, for example).

Figure 5A:
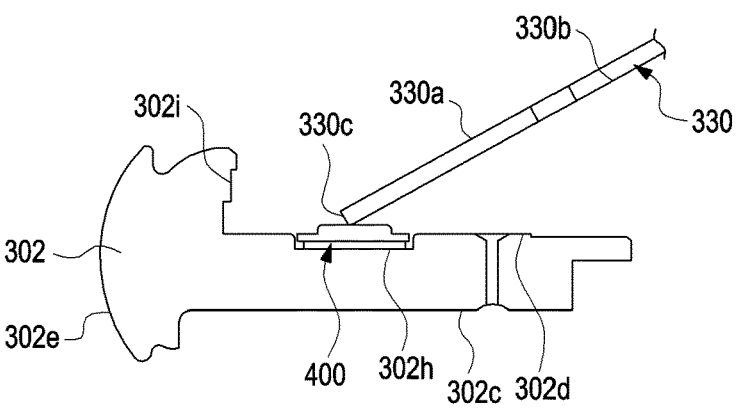
FIGS. 5A-5D are diagrams illustrating coupling of a printed circuit board to a plate according to an embodiment.
Figure 5B:
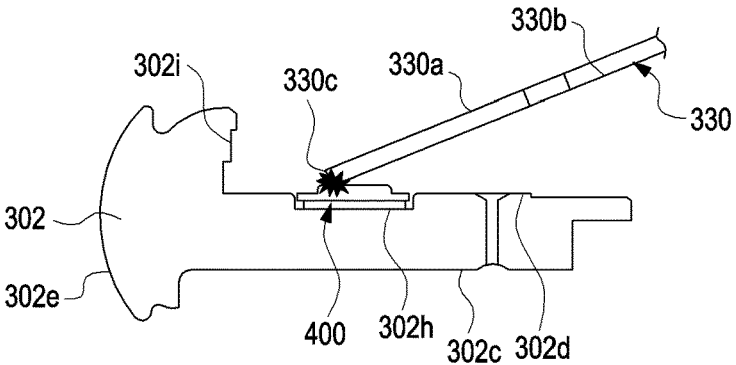
Figure 5C:
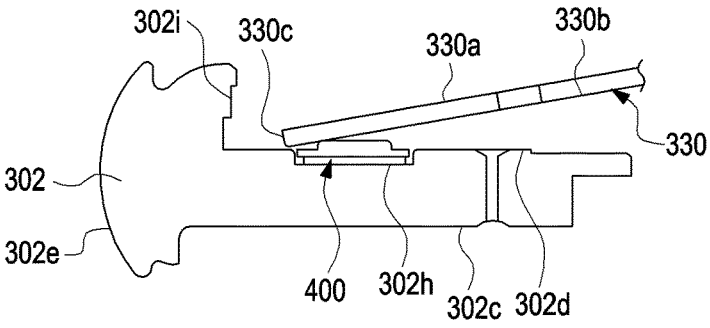
Figure 5D:
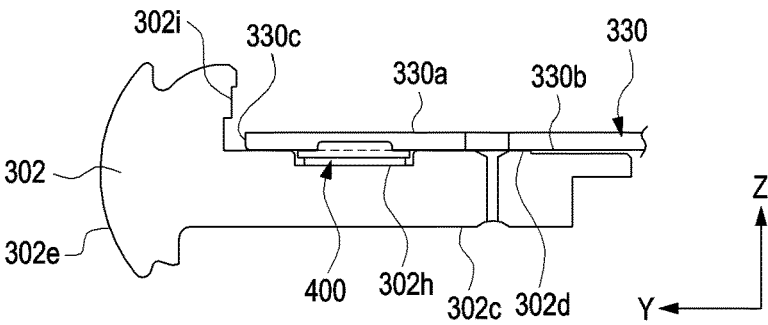

However, in the process of disposing the PCB 330 on one surface (e.g., the second surface 302d) of the plate 302 in this manner, a problem may arise, such as the first end 330c of the PCB 330 pressing against an upper surface of the waterproof structure 400, causing the waterproof structure 400 to tear or be pushed (indicated as a star in FIG. 5B). For example, the PCB 330 may be slid along the waterproof structure 400 such as shown in FIG. 5C to FIG. 5D, to damage the waterproof structure 400.

Figure 6A:
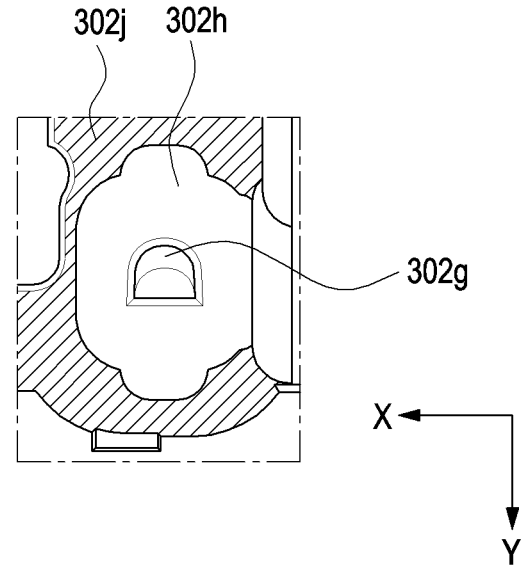
FIG. 6A is a front view illustrating a seating surface and a vent hole as viewed from above according to an embodiment.
Figure 6B:
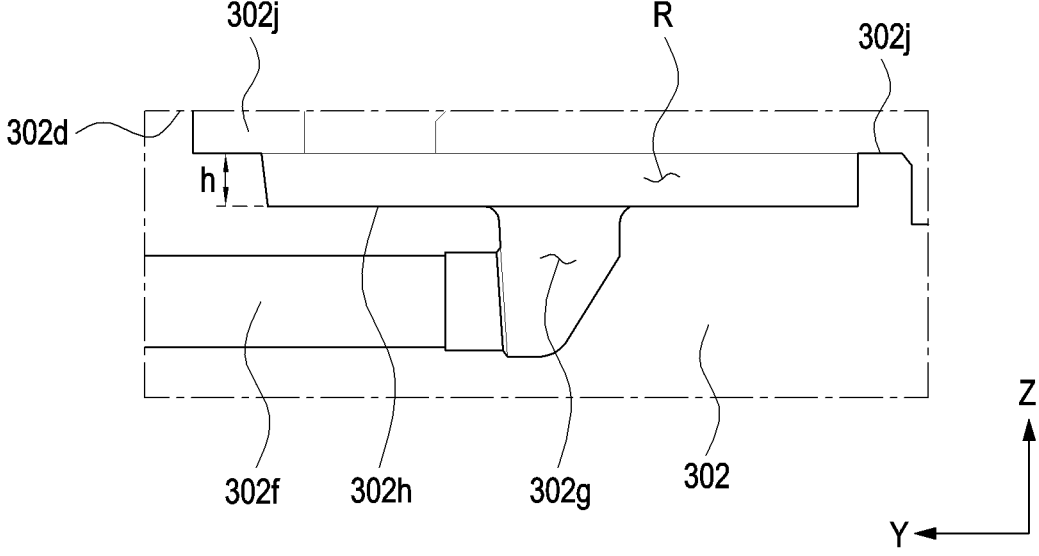
FIG. 6B is a side view illustrating a seating surface and a vent hole as viewed from a side according to an embodiment.

FIG. 6A is a front view (e.g., a top plan view) illustrating a seating surface and a vent hole as viewed from above according to an embodiment. FIG. 6B is a side view illustrating the seating surface and the vent hole as viewed from a side according to an embodiment.

Referring to FIGS. 6A and 6B together, the second surface 302d of the plate 302 on which the PCB 330 is disposed may be manufactured by means of molding and/or machining. For example, the seating surface 302h defined at a predetermined depth h may be defined by machining a solid portion of the plate 302 from the second surface 302d, to form a recess R for accommodating the waterproof structure on the plate 302. In another example, the second surface 302d of the plate 302 may further include a computerized numerical control (CNC)-machined surface 302j in addition to the seating surface 302h for forming the recess R., where a step is formed by the (CNC)-machined surface 302j and the seating surface 302h. According to an embodiment, the seating surface 302h may have a step from the machined surface 302j by the predetermined depth h. The waterproof structure is disposed to cover (or overlap) the entirety of the second opening 302g extending from the vent hole.

Although the waterproof structure may be formed such that its thickness (height) corresponds to the depth h of the recess R, there may be an error from an ideal thickness (height) due to a machining tolerance in manufacturing a product. When the thickness (height) of the waterproof structure is excessively large, the compressive force of the waterproof structure may increase, for example, due to an elastic member included in the waterproof structure, which may cause a deviation in the frequency response characteristics of the product (e.g., a microphone) or cause defects such as solder cracking. When the compressive force is small, there may be insufficient sealing, resulting in sound leakage, which may cause a problem such as howling or echo. Moreover, increasing the thickness of the waterproof structure to provide sufficient sealing may cause a problem such as tearing or pushing of the waterproof structure, as described before with reference to the embodiment of FIGS. 5A to 5D.

Figure 7A:
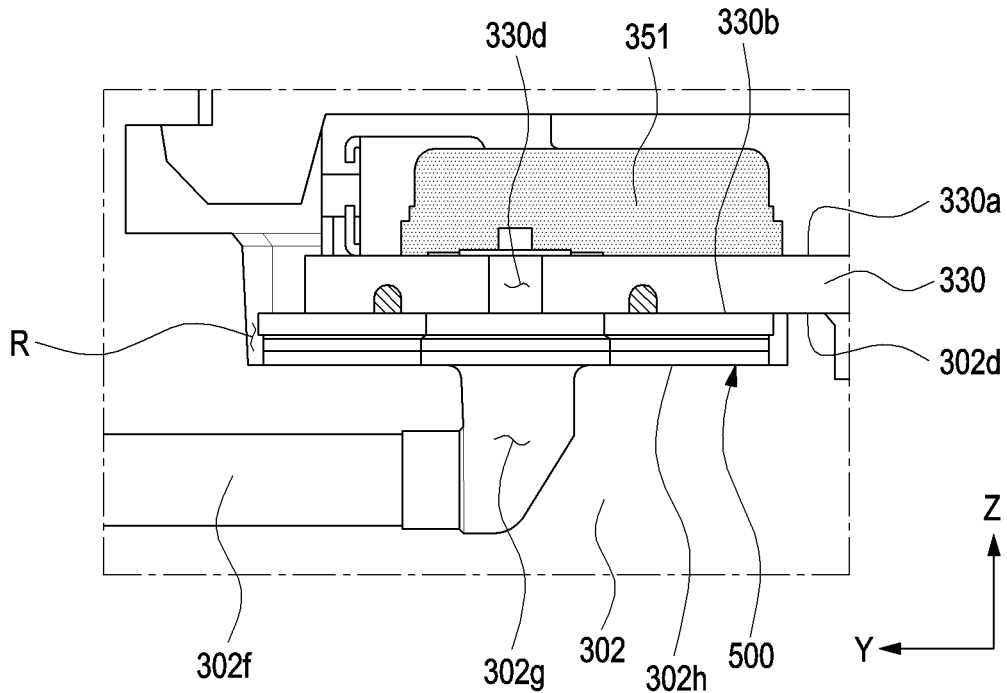
FIG. 7A is an enlarged side view illustrating a waterproof membrane assembly accommodated in a recess according to a first comparative embodiment.
Figure 7B:
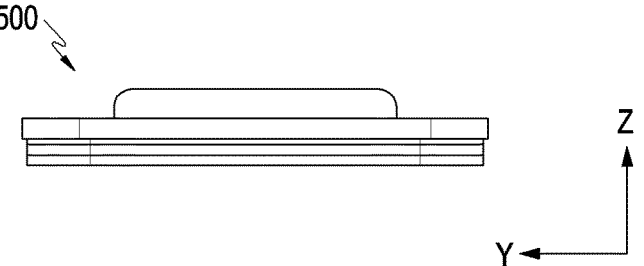
FIGS. 7B to 7D are a side view, a perspective view and a cross-sectional view, respectively, illustrating the waterproof membrane assembly according to the first comparative embodiment.
Figure 7C:
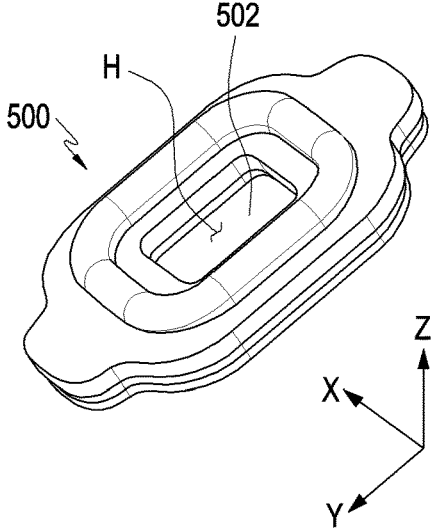
Figure 7D:
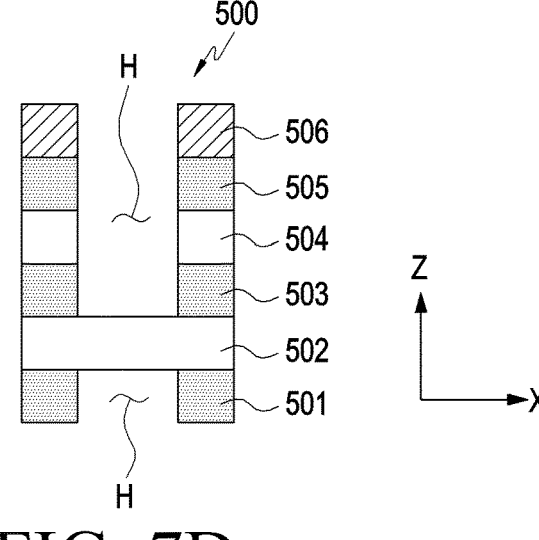

FIG. 7A is an enlarged side view illustrating a waterproof membrane assembly accommodated in a recess according to a first comparative embodiment. FIGS. 7B to 7D are a side view, a perspective view and a cross-sectional view, respectively, illustrating the waterproof membrane assembly according to the first comparative embodiment.

Figure 8A:
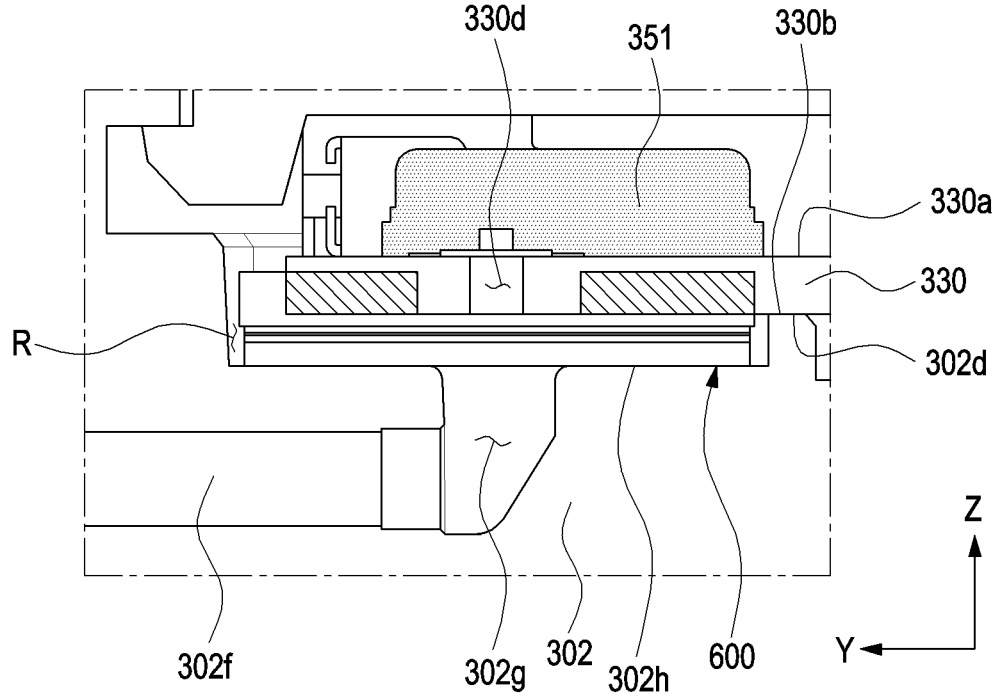
FIG. 8A is an enlarged side view illustrating a waterproof membrane assembly accommodated in a recess according to a second comparative embodiment.
Figure 8B:
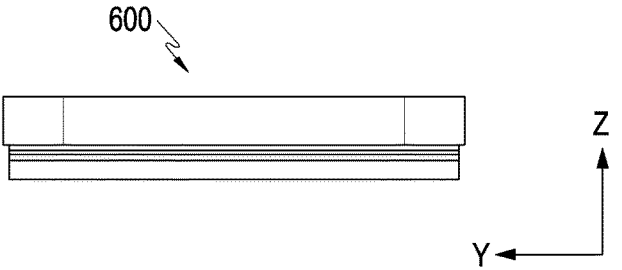
FIGS. 8B to 8D are a side view, a perspective view and a cross-sectional view, respectively, illustrating the waterproof membrane assembly according to the second comparative embodiment.
Figure 8C:
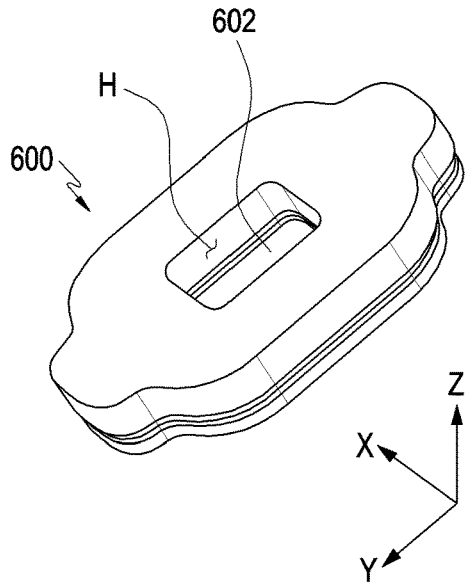
Figure 8D:
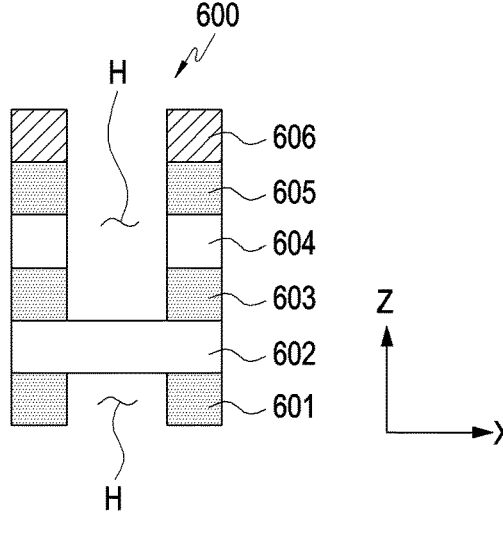

FIG. 8A is an enlarged side view illustrating a waterproof membrane assembly accommodated in a recess according to a second comparative embodiment. FIGS. 8B to 8D are a side view, a perspective view and a cross-sectional view, respectively, illustrating the waterproof membrane assembly according to the second comparative embodiment.

The afore-mentioned waterproof structure may be implemented as waterproof membrane assemblies 500 and 600 each in the form of a plurality of stacked sheets according to the embodiments illustrated in FIGS. 7A to 8D.

Each of the waterproof membrane assemblies 500 and 600 may be disposed between the PCB 330 and the seating surface 302h of the plate 302. The PCB 330 may have the electronic component 351 (the audio module, for example, the 'microphone') disposed on the first surface 330a, and the second surface 330b facing the waterproof membrane assembly 500 or 600.

A third opening 330d may be formed in the PCB 330 at a position corresponding to a sound collecting hole of the electronic component 351. The third opening 330d may be aligned with the second opening 302g formed at the other end of the vent hole 302f.

Each of the waterproof membrane assemblies 500 and 600 may include a waterproof ventilation sheet (e.g., a membrane) (or waterproof breathable sheet) which allows sound transmission through the flow of air, while restricting the movement of other fluids. According to an embodiment, the waterproof membrane assemblies 500 and 600 may be structured such that sound is transmitted by causing sound waves to vibrate the membrane and reproducing the sound waves on the other side of the membrane. Further, each of the waterproof membrane assemblies 500 and 600 may include at least one adhesive member (e.g., adhesive tape). Further, each of the waterproof membrane assemblies 500 and 600 may include a sealing member in close contact with the rear surface of the PCB.

Referring to FIGS. 7A to 7D, the waterproof membrane assembly 500 according to the first comparative embodiment may include a sealing member 506 as a sealing layer having elasticity such as liquid silicone rubber. The sealing member 506 may include a protrusion (e.g., an emboss) projecting in one direction from the sealing member 506, and the protrusion may have a structure which overlaps with the second surface 330*b* of the PCB 330 to seal sound. According to an embodiment, the waterproof membrane assembly 500 may include a first adhesive tape 501 as a first adhesive layer, a membrane 502 which is a waterproof breathable sheet, a second adhesive tape 503 as a second adhesive layer, a support member 504 (e.g., a support ring), a third adhesive tape 505 as a third adhesive layer, and the scaling member 506 including rubber.

The sealing member 506 may be configured to be in close contact with the second surface 330*b* of the PCB 330, with the first adhesive tape 501, the membrane 502, the second adhesive tape 503, the support member 504, the third adhesive tape 505, and the sealing member 506 stacked sequentially and the first adhesive tape 501 mounted on the seating surface 302*h* of the plate 302. Each of the first adhesive tape 501, the second adhesive tape 503, the support member 504, the third adhesive tape 505, and the sealing member 506 except for the membrane 502 may have a shape in which a hole H is formed through its center, and the hole may be aligned with the second opening 302*g* of the vent hole 302*f* and the third opening 330*d* of the PCB 330.

Referring to FIGS. 8A to 8D, the microphone waterproof membrane assembly 600 according to the second comparative embodiment may include a sealing member 606 as a scaling layer having elasticity, such as a sponge (e.g., polyurethane foam). The sealing member 606 may be compressed between the PCB 330 and the plate 302 to implement a sound sealing function. According to an embodiment, the waterproof membrane assembly 600 may include a first adhesive tape 601, a membrane 602 which is a waterproof breathable sheet, a second adhesive tape 603, a support member 604 (such as a support ring), a third adhesive tape 605, and the sealing member 606 including a sponge.

The sealing member 606 may be configured to be in close contact with the second surface 330*b* of the PCB 330, with the first adhesive tape 601, the membrane 602, the second adhesive tape 603, the support member 604, the third adhesive tape 605, and the scaling member 606 stacked sequentially, and the first adhesive tape 601 mounted on the seating surface 302*h* of the plate 302. Each of the first adhesive tape 601, the second adhesive tape 603, the support member 604, the third adhesive tape 605, and the sealing member 606 except for the membrane 602 may have a shape in which a hole H is formed through its center, and the hole may be aligned with the second opening 302*g* of the vent hole 302*f* and the third opening 330*d* of the PCB 330.

The embodiment (first comparative embodiment) illustrated in FIGS. 7A to 7D is a structure with a sealing member having high elasticity and low hardness, and the embodiment (second comparative embodiment) illustrated in FIGS. 8A to 8D is a structure which facilitates adjustment of a compressive force through adjustment of the thickness or density of a sponge. While both the embodiment (first comparative embodiment) illustrated in FIGS. 7A to 7D and the embodiment (second comparative embodiment) illustrated in FIGS. 8A to 8D are advantageous for preventing leakage, they are still vulnerable to tearing or pushing during assembly of the PCB.

Figure 9A:
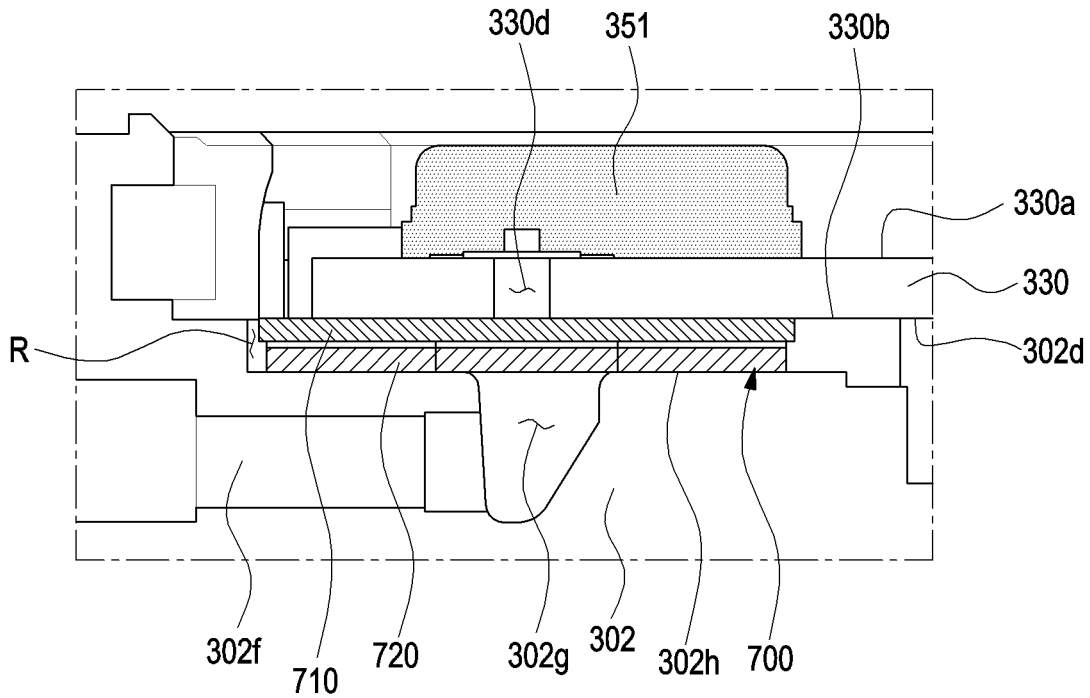
FIG. 9A is an enlarged side view illustrating a waterproof membrane assembly accommodated in a recess according to an embodiment.
Figure 9B:
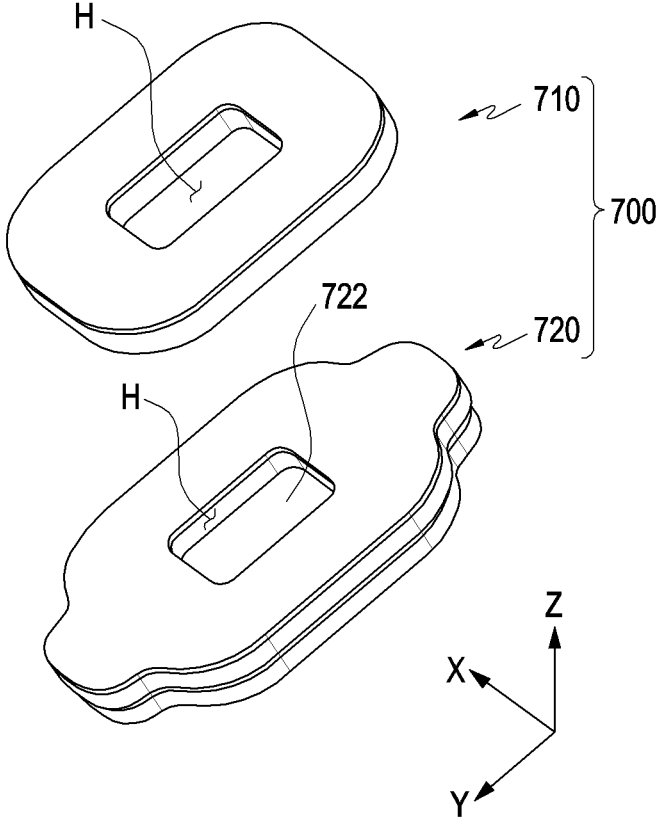
FIG. 9B is an exploded perspective view illustrating a waterproof membrane assembly according to an embodiment.

FIG. 9A is a side view illustrating a waterproof membrane assembly accommodated in a recess according to an embodiment. FIG. 9B is an exploded perspective view illustrating the waterproof membrane assembly according to an embodiment.

The embodiment of FIGS. 9A and 9B discloses a waterproof membrane assembly 700 in which two physically separated sub-assemblies 710 and 720 are combined, unlike the embodiment (first comparative embodiment) illustrated in FIGS. 7A and 7B and the embodiment (second comparative embodiment) illustrated in FIGS. 8A and 8B. According to an embodiment of the disclosure, the electronic device 101 may include the waterproof membrane assembly 700 which is configured to be at least partially accommodated in the recess R formed in the plate 302 and formed as a combination of a sealing member 710 (hereinafter, referred to as a 'first sub-assembly 710') and a waterproof member 720 (hereinafter, referred to as a 'second sub-assembly 720'). The sealing member 710 as a sealing layer and the waterproof member 720 as a waterproof breathable layer may be separable from each other.

The first sub-assembly 710 may be disposed on the second surface 330*b* of the PCB 330 and include a first adhesive member as a first adhesive layer and a first elastic member as a first elastic layer. The second sub-assembly 720 may be disposed on the seating surface 302*h* which is formed recessed from the second surface 302*d* of the plate 302 and include a second adhesive member as a second adhesive layer, a second elastic member as a second elastic layer, and a membrane 722 as an air (or sound) transmitting waterproof layer. That is, the first sub-assembly 710 and the second sub-assembly 720 may be disposed on a same side (e.g., the second surface 330*b* of the PCB 330). As the waterproof membrane assembly 700 of the disclosure further includes a reinforcement member in at least one of the first sub-assembly 710 and the second sub-assembly 720, it may address the disadvantages of the afore-mentioned embodiments of FIGS. 7A and 7B (the first comparative embodiment) and FIGS. 8A and 8B (the second comparative embodiment), while ensuring better acoustic performance. Details of each of the components included in the waterproof membrane assembly 700 will be described in more detail with reference to FIG. 12A and the following drawings.

Figure 10A:
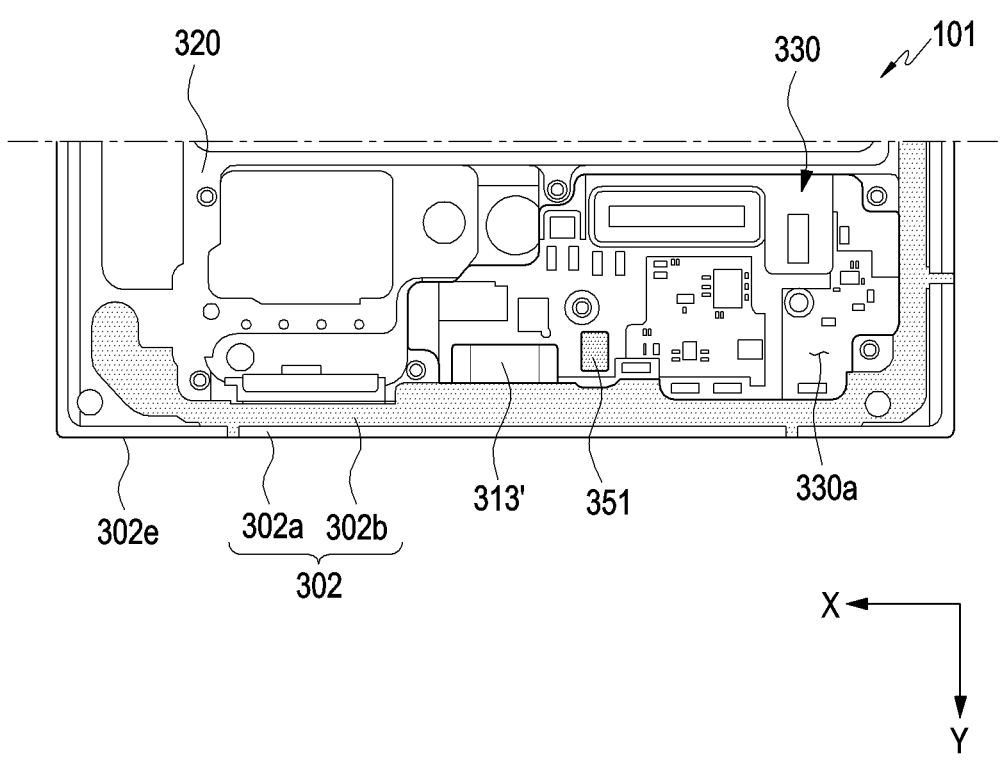
FIG. 10A is a diagram illustrating a plan view of a printed circuit board disposed to face a second surface of a plate and an audio module which is disposed on a first surface of the printed circuit board according to an embodiment.
Figure 10B:
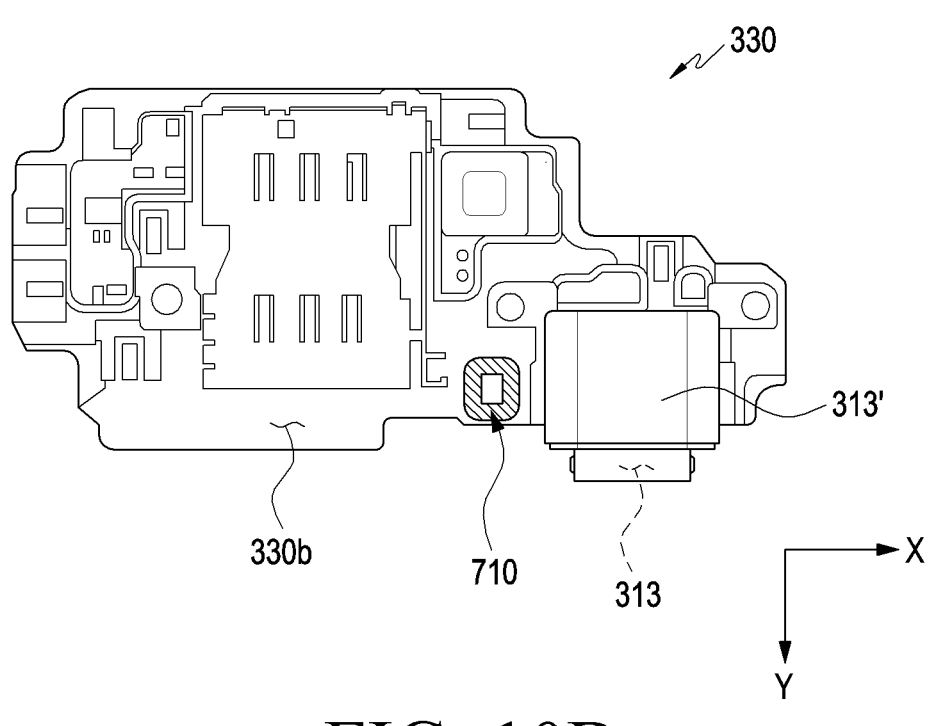
FIG. 10B is a diagram illustrating a plan view of a printed circuit board and a sealing member (a first sub-assembly) which is disposed on a second surface of the printed circuit board according to an embodiment.
Figure 10C:
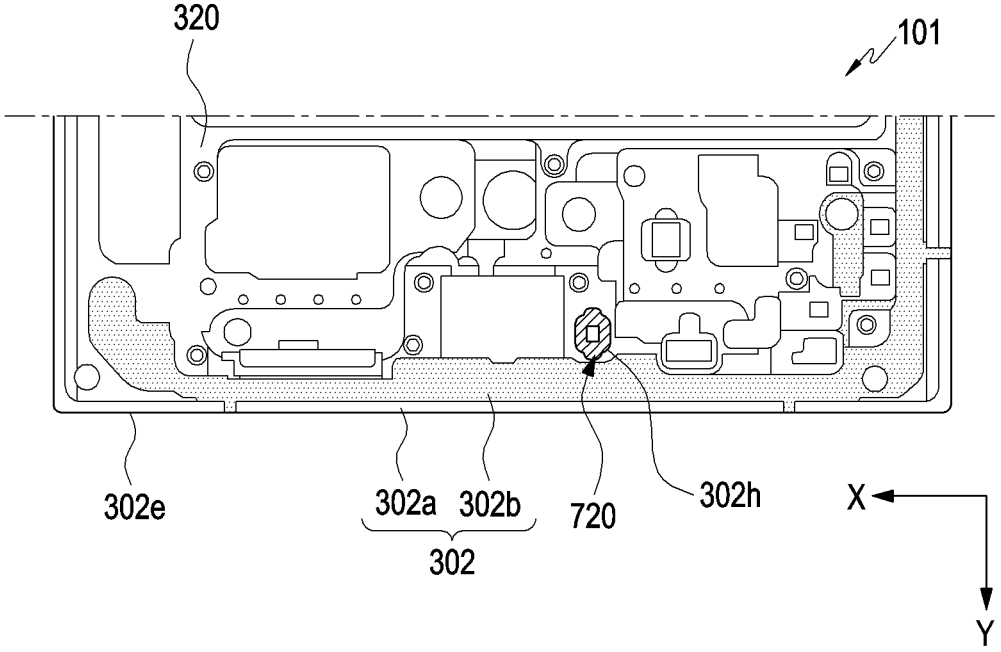
FIG. 10C is a diagram illustrating a plan view of a plate and a waterproof member (a second sub-assembly) which is disposed on a second surface of the plate, before a printed circuit board is disposed according to an embodiment.

FIG. 10A is a diagram illustrating a PCB disposed to face a second surface of a plate, and an audio module disposed on a first surface of the PCB according to an embodiment. FIG. 10B is a diagram illustrating the PCB and a sealing member (a first sub-assembly) disposed on a second surface of the PCB according to an embodiment. FIG. 10C is a diagram illustrating the plate and a waterproof member (a second sub-assembly) disposed on the second surface of the plate, before the PCB is disposed according to an embodiment.

Referring to FIG. 10A, the electronic device 101 according to an embodiment may be configured by coupling the plate 302 including the first portion 302*a* including a conductive material and the second portion 302*b* including a non-conductive material, to at least one circuit board among PCB 320 and PCB 330. According to an embodiment, the first portion 302*a* may be configured at a position adjacent to the side surface 302*e* of the plate 302 to be insulated from the second portion 302*b*, such that the first portion 302*a* may be used as an antenna. That is, the first portion 302*a* may be closer to an outside of the electronic device 101 than the second portion 302*b*, in a planar direction along the plate 302.

Two types of PCBs 320 and 330 are illustrated as the PCBs 320 and 330 illustrated in FIGS. 10A, 10B and 10C.

For example, one PCB (a first PCB 330) may be a sub-PCB, and the other PCB (a second PCB 320) may be a main PCB. It should be noted that the distinction between the sub-PCB and the main PCB is not made in order of importance, but for convenience of description. For example, the PCB 330 in the embodiments described before with reference to FIGS. 1 to 9 may be referred to as the 'sub-PCB 330', and the other PCB 320 may be referred to as the 'main PCB 320'.

According to an embodiment, the sub-PCB 330 may first be assembled to the plate 302, and then the main PCB 320 may be assembled to the plate 302. According to an embodiment, the electronic component 351 (the audio module, for example, the 'microphone'), which has been disposed on the first surface 330*a* of the sub-PCB 330, may be assembled into the electronic device 101, such as onto the plate 302 at the second surface 302*d* thereof. For example, according to the illustrations of FIGS. 10A and 10B, the electronic component 351 on the sub-PCB 330 and disposed at a position adjacent to the connector 313 forming a connector hole 313' may be described as an example. When the electronic component 351 (the audio module, for example, the 'microphone') is assembled in a state where it is disposed on the first surface 330*a* of the sub-PCB 330 which faces away from the plate 302, the process of assembling the sub-PCB 330 described before with reference to FIGS. 5*a* to 5D may be performed.

In an embodiment, the second sub-assembly 720 may be already disposed on the seating surface 302*h* of the plate 302, to face the sub-PCB 330 having both the electronic component 351 and the first sub-assembly 710 thereon. Here, the electronic component 351, the first sub-assembly 710 and the sub-PCB 330 may be movable together with each other, during assembly thereof to the plate 302. In the assembly process, the first sub-assembly 710 and the second sub-assembly 720 which are initially separate from each other, are moveable relative to each other.

In the electronic device 101 according to an embodiment of the disclosure, once the sub-PCB 330 having both the electronic component 351 and the first sub-assembly 710 thereon is assembled to the plate 302, the first sub-assembly 710 and the second sub-assembly 720 which are initially separated from each other, may come into contact with each other and be compressed, thereby forming the waterproof membrane assembly 700 as a sealing structure shown in FIG. 9A.

In the comparative embodiment of FIGS. 7A to 7D and the comparative embodiment of FIGS. 8A to 8D, the surfaces of the waterproof membrane assemblies 500 and 600 may be broken due to the relatively large heights defined by protruding portions of the waterproof membrane assemblies 500 and 600, when the sub-PCB 330 is assembled to the plate 302 (e.g., like in the process of FIGS. 5*a* to 5D). Reducing the thicknesses of the waterproof membrane assemblies 500 and 600 may reduce an angle at which the sub-PCB 330 and the waterproof membrane assemblies 500 and 600 contact and reduce interference during assembly of the sub-PCB 330, thereby reducing and/or minimizing breakage of the surfaces of the waterproof membrane assemblies 500 and 600. However, as the thicknesses of the waterproof membrane assemblies 500 and 600 are reduced, it may be difficult to balance a compressive force required for the waterproof membrane assemblies 500 and 600 with a dimensional tolerance of the plate 302 and sound leakage caused by thickness deviations of materials of the waterproof membrane assemblies 500 and 600 during the assembly of the sub-PCB 330.

In contrast, electronic device 101 according to an embodiment of the disclosure may provide a structure which reduces and/or minimizes deviations in the acoustic performance of the microphone while preventing breakage of the surface of the second sub-assembly 720 when the sub-PCB 330 is coupled to the plate 302.

In the disclosure, an outer surface of one of the first sub-assembly 710 and the second sub-assembly 720 may include a material with relatively high hardness (e.g., a reinforcement member (or a reinforcement layer)) to prevent breakage of the surface of the waterproof membrane assembly 700.

Figure 11A:
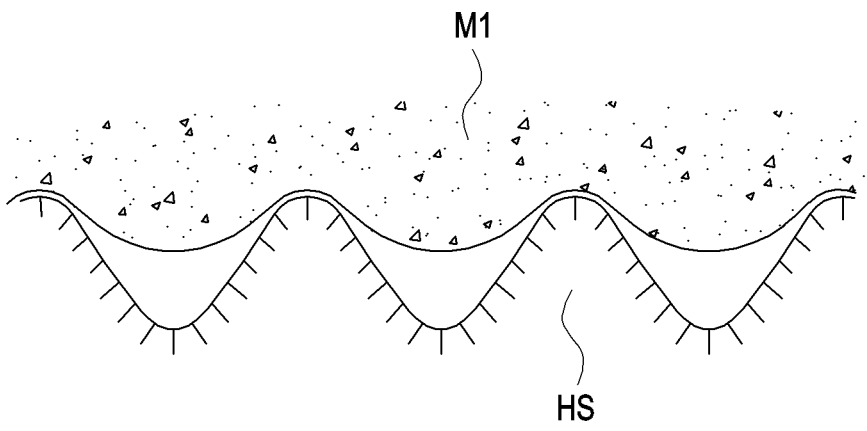
FIG. 11A is a diagram illustrating an enlarged cross-sectional view of a surface bonded state according to an embodiment.
Figure 11B:
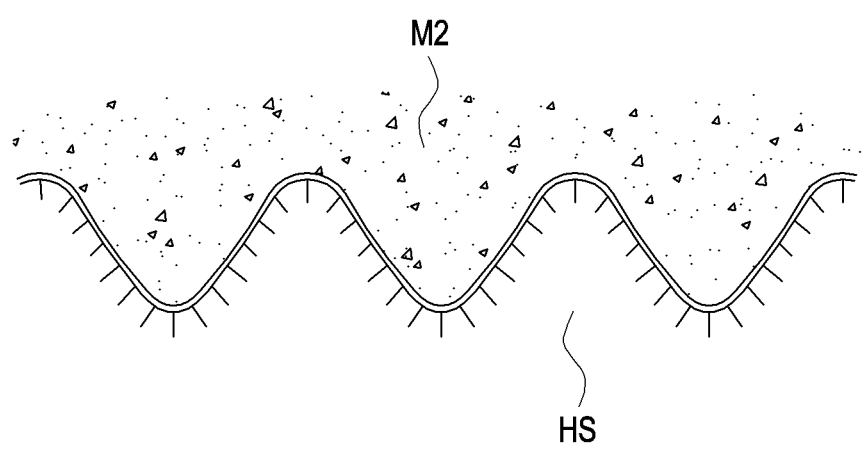
FIG. 11B is a diagram illustrating an enlarged cross-sectional view of a surface bonded state according to an embodiment.

FIG. 11A is a diagram illustrating a surface bonded state according to an embodiment. FIG. 11B is a diagram illustrating a surface bonded state according to an embodiment.

FIGS. 11A and 11B illustrate bonded states between two surfaces according to surface materials, in which one surface HS has a material with relatively high hardness.

FIG. 11A may illustrate a bonded state between two surfaces, when one surface HS having a material with high hardness and the other surface M1 having a material with high hardness (or substantially the same hardness as that of the one surface HS) face each other. When both of the surfaces facing each other are formed of materials with high hardness, sound leakage may occur due to a space between irregularities at the facing outer surfaces.

FIG. 11B may illustrate a bonded state between two surfaces, when one surface HS having a material with high hardness and the other surface M2 having a material with relatively low hardness (or hardness less than the hardness of the one surface HS)_face each other. It may be advantageous that the other surface M2 has a material with lower hardness than the one surface HS to prevent sound leakage, as referenced to FIG. 11B. When the surfaces facing each other are formed of materials with relatively different hardnesses, sound leakage may be reduced or effectively prevented due to a minimizing of a space or gap between irregularities at the facing outer surfaces.

In the disclosure, the waterproof membrane assembly 700 may have a first outer surface of one of the first sub-assembly 710 and the second sub-assembly 720 formed of a material with high hardness and a second outer surface of the other one of the first sub-assembly 710 and the sub-assembly 720 formed of a material with relatively low hardness as compared to the hardness of the first outer surface. For example, the high-hardness material may include, for example, polyethylene terephthalate (PET), and the low-hardness material may include, for example, a sponge or polyurethane foam.

The waterproof membrane assembly 700 of the disclosure will be described in more detail below.

Figure 12A:
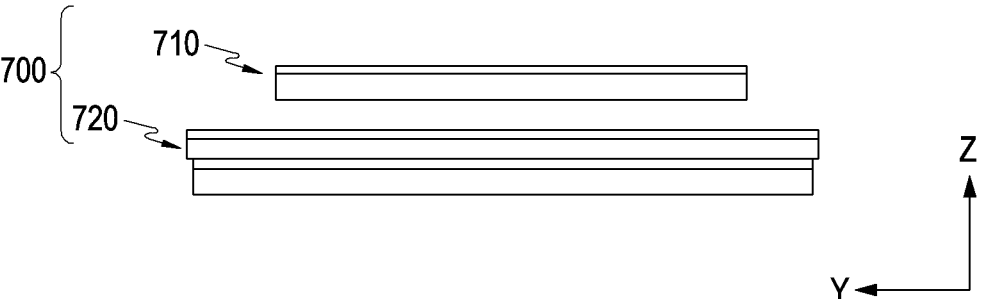
FIG. 12A is a diagram illustrating a side view of a waterproof membrane assembly including a sealing member (a first sub-assembly) and a waterproof member (a second sub-assembly) according to an embodiment.
Figure 12B:
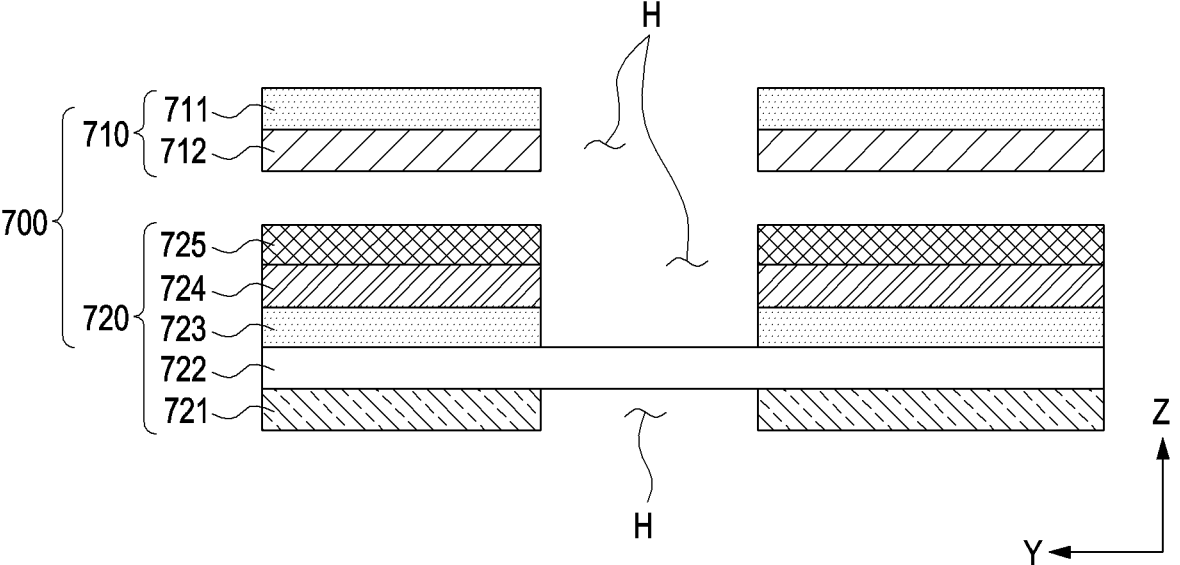
FIG. 12B is a diagram illustrating an enlarged cross-sectional view of layers included in a sealing member (a first sub-assembly) and a waterproof member (a second sub-assembly) according to an embodiment.

FIG. 12A is a diagram illustrating a waterproof membrane assembly including a sealing member (a first sub-assembly) and a waterproof member (a second sub-assembly) according to an embodiment. FIG. 12B is a diagram illustrating various layers included in the sealing member (the first sub-assembly) and the waterproof member (the second sub-assembly) according to an embodiment.

Referring to FIGS. 12A and 12B, the disclosure may provide the waterproof membrane assembly 700 which reduces and/or minimizes compression force deflection with a reduced overall height, and reduces and/or prevents breakage of its surface during assembly, which is a structure in which the two sub-assemblies 710 and 720 come into close contact with each other (e.g., forming an interface therebetween) and are compressed, thereby sealing a space (e.g., the recess R) between the sub-PCB 330 and the second opening 302g of the vent hole 302f. The disclosure may provide an acoustic sealing structure with two sub-assemblies in combination with each other to prevent sound leakage. The disclosure may also prevent wrinkling of the waterproof membrane, which might be otherwise caused by a high compressive force, by including an elastic member in each of the two sub-assemblies and thus maximizing the absorption of a compressive force. Further, the disclosure may reduce or prevent breakage of the surface of the waterproof membrane assembly by forming the surface of one of the two sub-assemblies with a high-hardness material.

The waterproof membrane assembly 700 of the disclosure may include the first sub-assembly 710 including a first adhesive member 711 and a first elastic member 712, and the second sub-assembly 720 including a second adhesive member 721, a second elastic member 724, and a membrane 722.

In the waterproof membrane assembly 700 of the disclosure, one of the first sub-assembly 710 and the second sub-assembly 720 may further include a reinforcement member 725 as a reinforcing layer exposed at an outer surface thereof, prior to assembly of the first sub-assembly 710 and the second sub-assembly 720 to each other. FIG. 12B illustrates an embodiment in which the reinforcement member 725 is included in the second sub-assembly 720 and exposed on a surface of the second sub-assembly 720.

The first adhesive member 711 and/or the second adhesive member 721 may be, for example, an adhesive tape. The first adhesive member 711 and/or the second adhesive member 721 may include an adhesive material with an adjustable compressive force, such as polyethylene (PE), acryl, epoxy, urethane, silicone, or rubber, and a base formed of a material, such as polyolefin foam, polyethylene form, a polyethylene terephthalate (PET) film. According to an embodiment, the first adhesive member 711 and/or the second adhesive member 721 may correspond to a double-sided adhesive member including a base between two adhesive materials. According to an embodiment, the first adhesive member 711 and/or the second adhesive member 721 may be a double-sided adhesive member added with waterproof performance. For example, the first adhesive member 711 may be formed as a general double-sided adhesive member, and the second adhesive member 721 may be formed as a double-sided adhesive member added with waterproof performance.

According to an embodiment, the second sub-assembly 720 may further include a third adhesive member 723, as illustrated in FIG. 12B. Although the first adhesive member 711, the second adhesive member 721, and the third adhesive member 723 may all be formed according to the same specification, of the same material, and/or in the same shape, the disclosure is not necessarily limited thereto, and they may all be formed in different specifications, of different materials, and/or in different shapes.

Referring to FIG. 12B, the waterproof membrane assembly 700 of the disclosure may include the first adhesive member 711 disposed on (or closest to) the second surface 330b of the sub-PCB 330, and the second adhesive member 721 disposed on (or closet to) the second surface 302d (e.g., the seating surface 302h) of the plate 302. The first adhesive member 711 may be a double-sided adhesive member, with one surface bonded to the second surface 330b of the sub-PCB 330 and the other surface bonded to the first elastic member 712. The second adhesive member 721 may also be a double-sided adhesive member, with one surface bonded to the second surface 302d (e.g., the seating surface 302h) of the plate 302 and the other surface bonded to the membrane 722. In the disclosure, the second sub-assembly 720 may include the third adhesive member 723, which may have one surface bonded to the membrane 722 and the other surface bonded to the second elastic member 724. According to an embodiment, the second adhesive member 721 may be configured to be disposed between the second opening 302g of the vent hole 302h and the membrane 722 and provided as a waterproof adhesive member for which damage to a waterproof membrane caused by shear stress is prevented.

The membrane 722, which is a waterproof membrane, may protect the electronic device 101 from the introduction of dust and moisture and have a function of achieving high-quality acoustic performance by converting atmospheric energy received from one direction into mechanical vibrations by vibrating in effective response to sound waves and allowing transmission of the vibrations to the other side of the membrane. The membrane 722 may be include a material such as polytetrafluoroethylene (PTFE), expanded PTFE (PTFE), and polyvinylidene fluoride (PVDF).

The first elastic member 712 and the second elastic member 724 may be provided in the first sub-assembly 710 and the second sub-assembly 720, respectively. Referring to FIG. 12B, the first elastic member 712 may be an outer element of the first sub-assembly 710 to provide an outer surface thereof, prior to assembly of the first sub-assembly 710 and the second sub-assembly 720.

The reinforcement member 725 may be an outer element of the second sub-assembly 720 to provide an outer surface thereof, prior to the assembly of the first sub-assembly 710 and the second sub-assembly 720, and the second elastic member 724 may be disposed on the rear surface of the reinforcement member 725. When the first sub-assembly 710 and the second sub-assembly 720 are assembled, the reinforcement member 725 with high hardness may come into close contact with the first elastic member 712 with relatively low hardness. The reinforcement member 725 may include a material such as SUS and PET and have relatively high hardness, rigidity, and strength and good sliding properties (slipability) and wear resistance, compared to the first elastic member 712. Since the reinforcement member 725 assembled with its surface exposed on the second sub-assembly 720 provides an outer surface of the second sub-assembly 720, friction-induced breakage may be reduced and/or prevented by its high slipability.

According to embodiments, the first elastic member 712 and the second elastic member 724 may be integrally fabricated with a relatively high-hardness support member (e.g., PET), and in this case, may have better stability under high stress, high strain conditions. When a compressive force is applied during assembly of the first sub-assembly 710 and the second sub-assembly 720, sealing may then be implemented due to a repulsive force generated by the first elastic member 712 and the second elastic member 724 at the moment. The elastic members may have different compressive forces depending on their densities, and the performance of sound leakage and frequency response characteristics may be achieved when the elastic members have a density of about 0.3 gram per cubed centimeters (g/cm$^3$) to about 0.7 g/cm$^3$) and a compression ratio of about 50% to about 90%. When the first elastic member 712 and the second elastic member 724 have different densities, the less dense elastic member may be compressed first.

Referring to the embodiment illustrated in FIGS. 12A and 12B, the waterproof membrane assembly 700 of the disclosure will be summarized. When the sub-PCB 330 is assembled to the plate 302, the first sub-assembly 710 disposed on the sub-PCB 330 and the second sub-assembly 720 disposed on the plate 302 may be brought into close contact and compressed against each other. At this time, the reinforcement member 725 included in the second sub-assembly 720 and the first elastic member 712 included in the first sub-assembly 710 may come into contact with each other at a contact area of the waterproof membrane assembly 700, thereby preventing sound leakage and tearing/pushing. Further, the first elastic member 712 included in the first sub-assembly 710 and the second elastic member 724 included in the second sub-assembly 720 may be compressed against each other, thereby relieving a compressive force (primary relief). Additionally, as the first adhesive member 711 included in the first sub-assembly 710 and the second adhesive member 721 and/or the third adhesive member 723 included in the second sub-assembly 720 are compressed against each other, the compressive force may be further relieved (secondary relief). The waterproof membrane assembly 700 of the disclosure may provide an appropriate compressive force for scaling, while avoiding a problem such as tearing/pushing/wrinkling of the waterproof membrane caused by a high compressive force.

Various embodiments of a waterproof membrane assembly will be described below with reference to FIGS. 13A, 13B, 13C, 13D, 13E, 13F, 13G, 13H, 13I, 13J, and 13K.

Figure 13A:
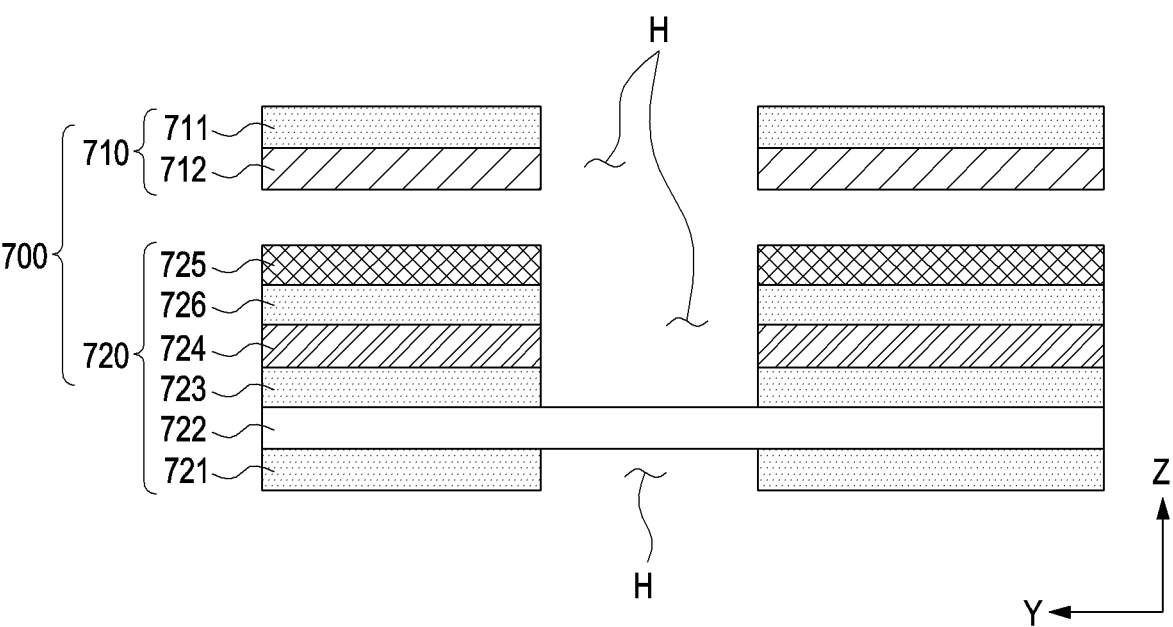
FIG. 13A is a diagram illustrating an enlarged cross-sectional view of a waterproof membrane assembly according to an embodiment.
Figure 13B:
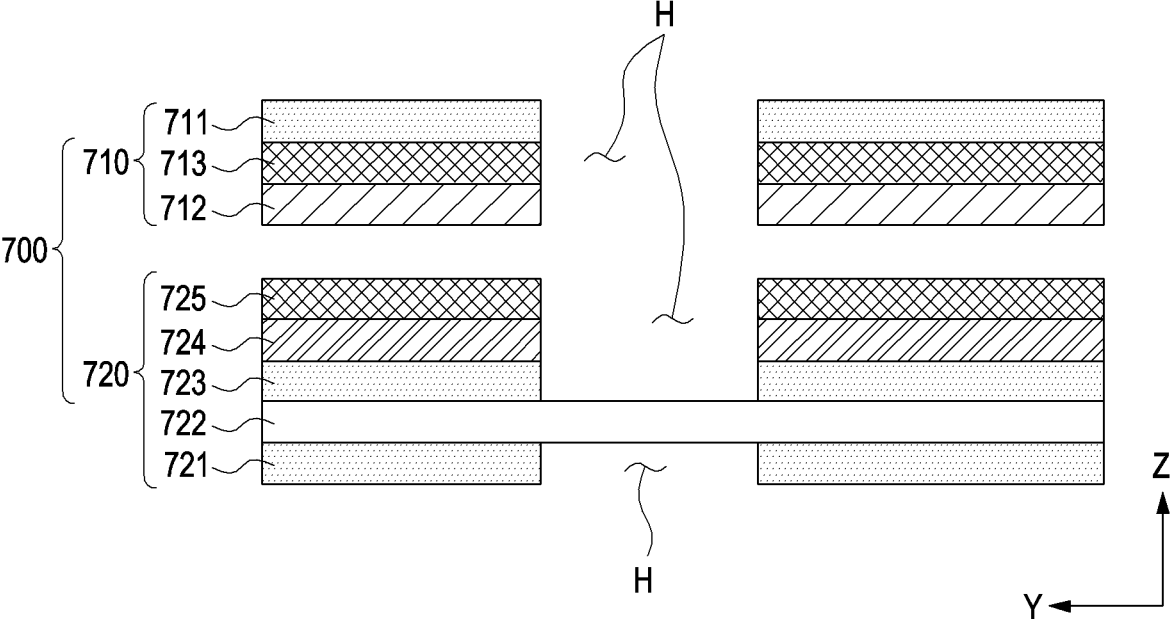
FIG. 13B is a diagram illustrating an enlarged cross-sectional view of a waterproof membrane assembly according to an embodiment.
Figure 13C:
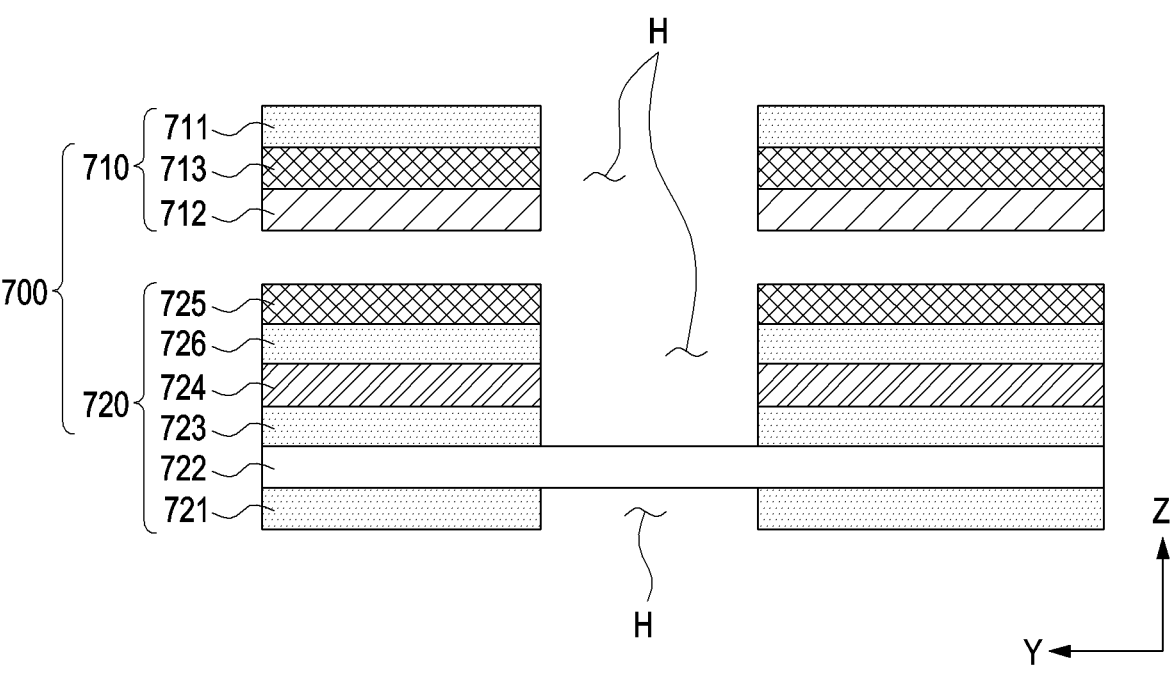
FIG. 13C is a diagram illustrating an enlarged cross-sectional view of a waterproof membrane assembly according to an embodiment.
Figure 13D:
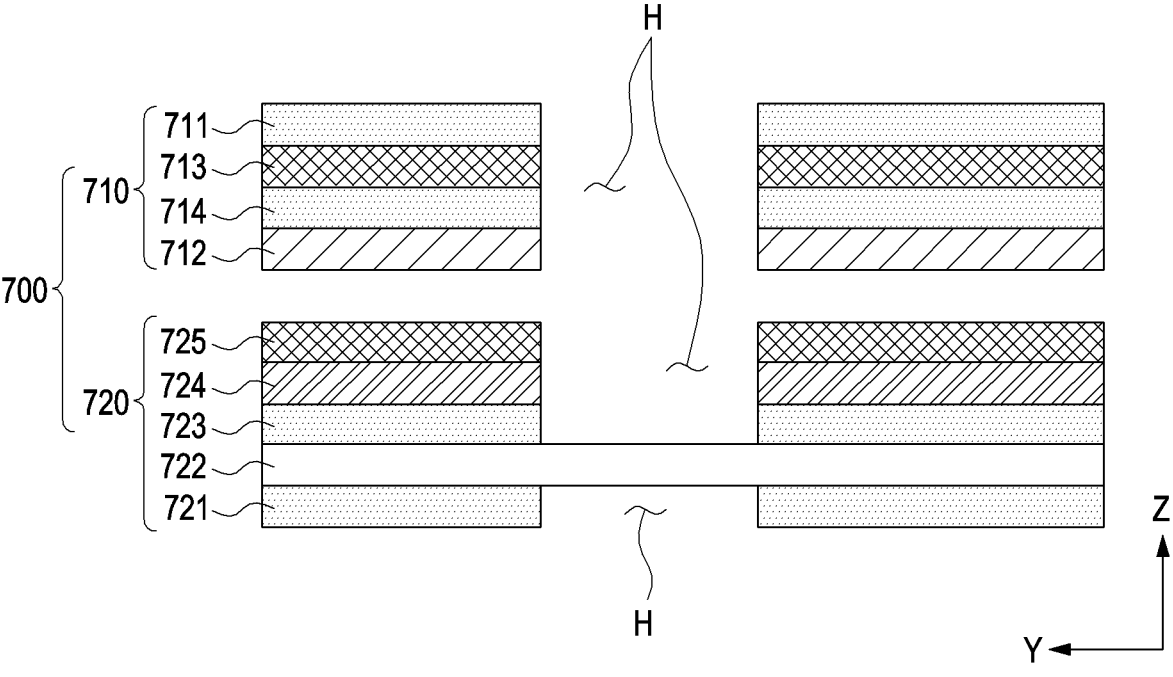
FIG. 13D is a diagram illustrating an enlarged cross-sectional view of a waterproof membrane assembly according to an embodiment.
Figure 13E:
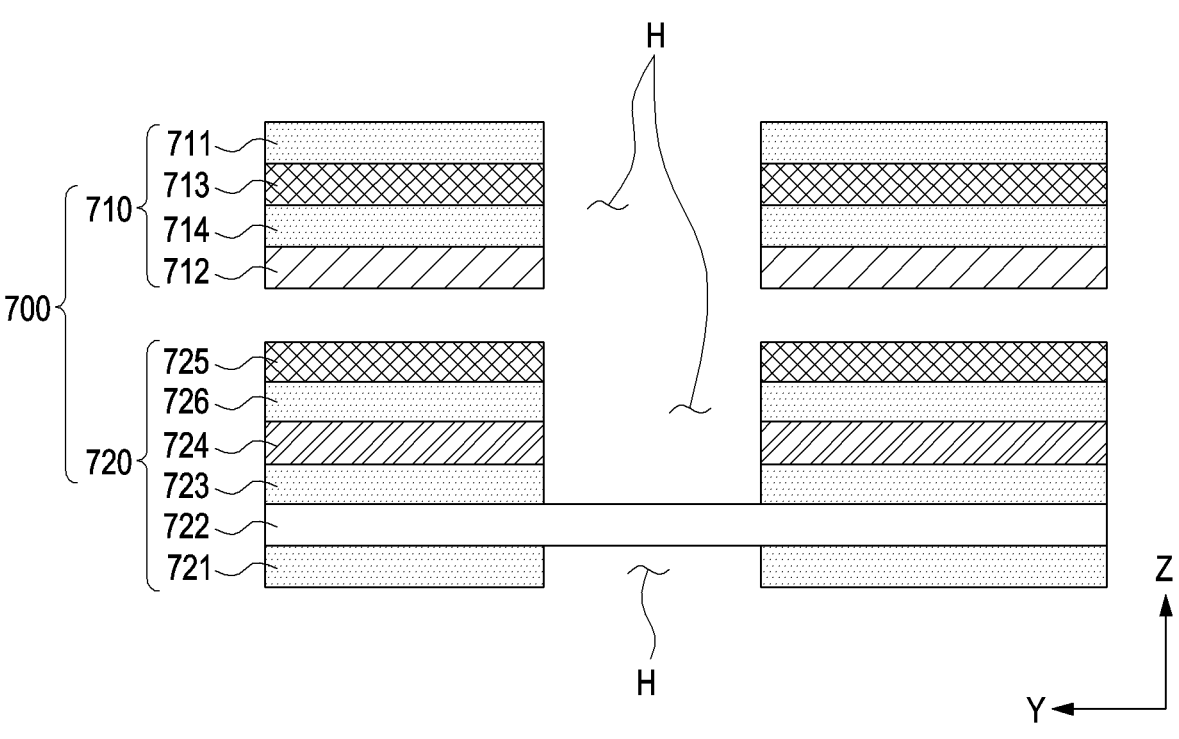
FIG. 13E is a diagram illustrating an enlarged cross-sectional view of a waterproof membrane assembly according to an embodiment.
Figure 13F:
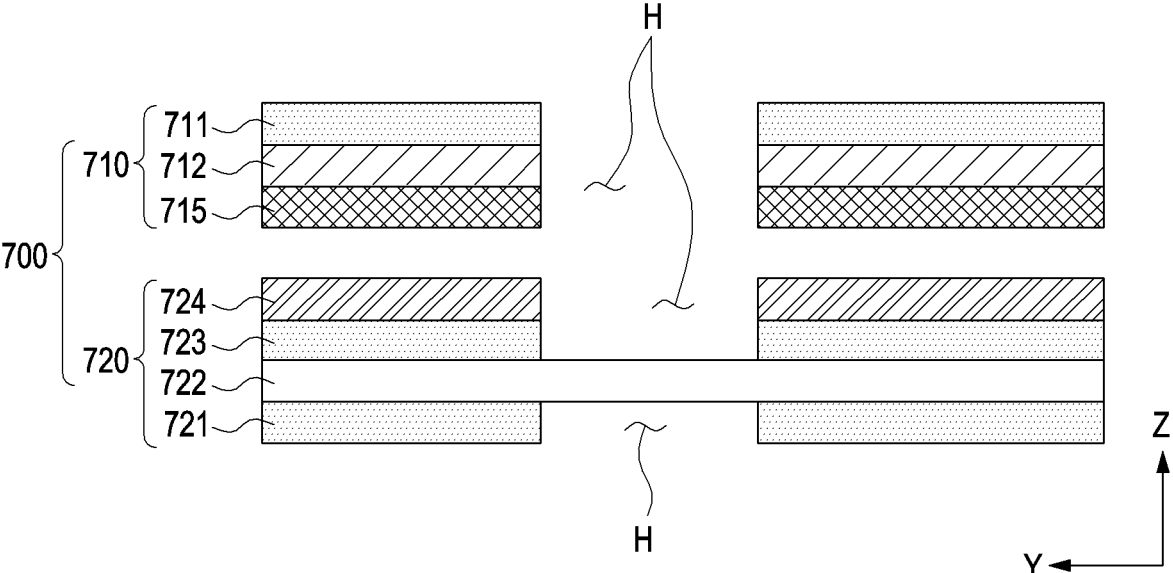
FIG. 13F is a diagram illustrating an enlarged cross-sectional view of a waterproof membrane assembly according to an embodiment.
Figure 13G:
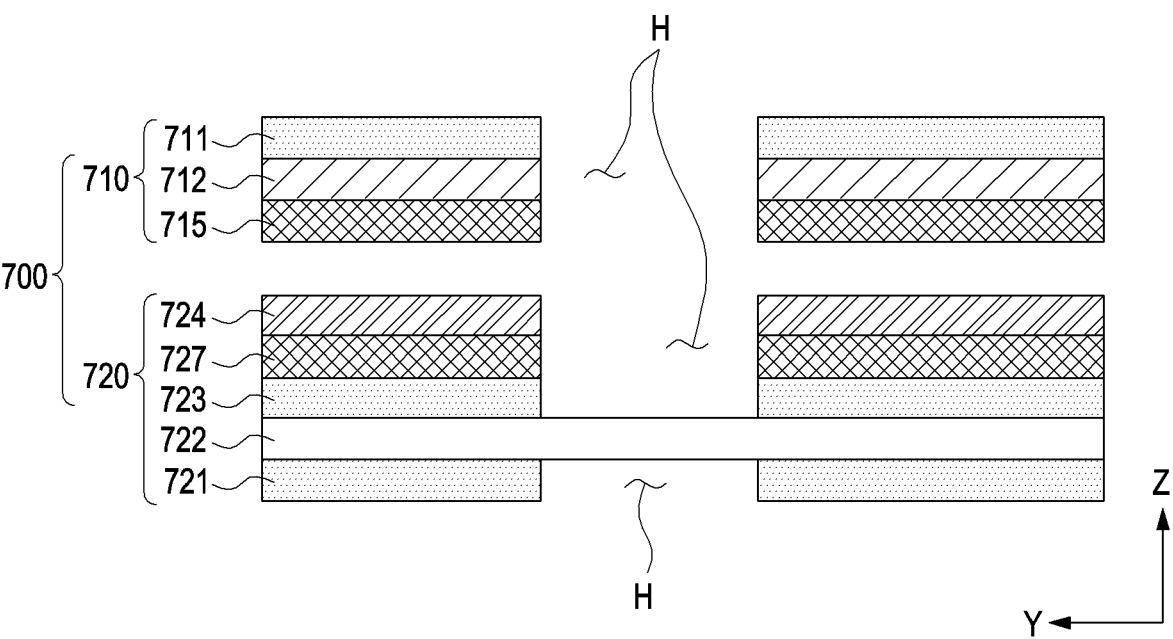
FIG. 13G is a diagram illustrating an enlarged cross-sectional view of a waterproof membrane assembly according to an embodiment.
Figure 13H:
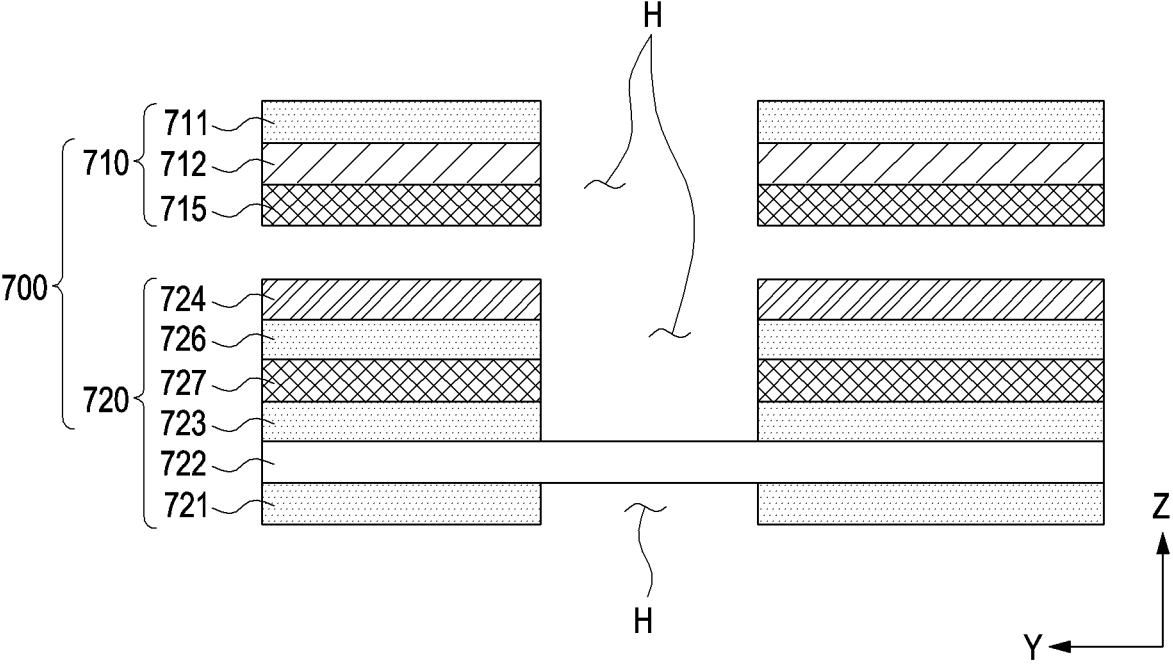
FIG. 13H is a diagram illustrating an enlarged cross-sectional view of a waterproof membrane assembly according to an embodiment.
Figure 13I:
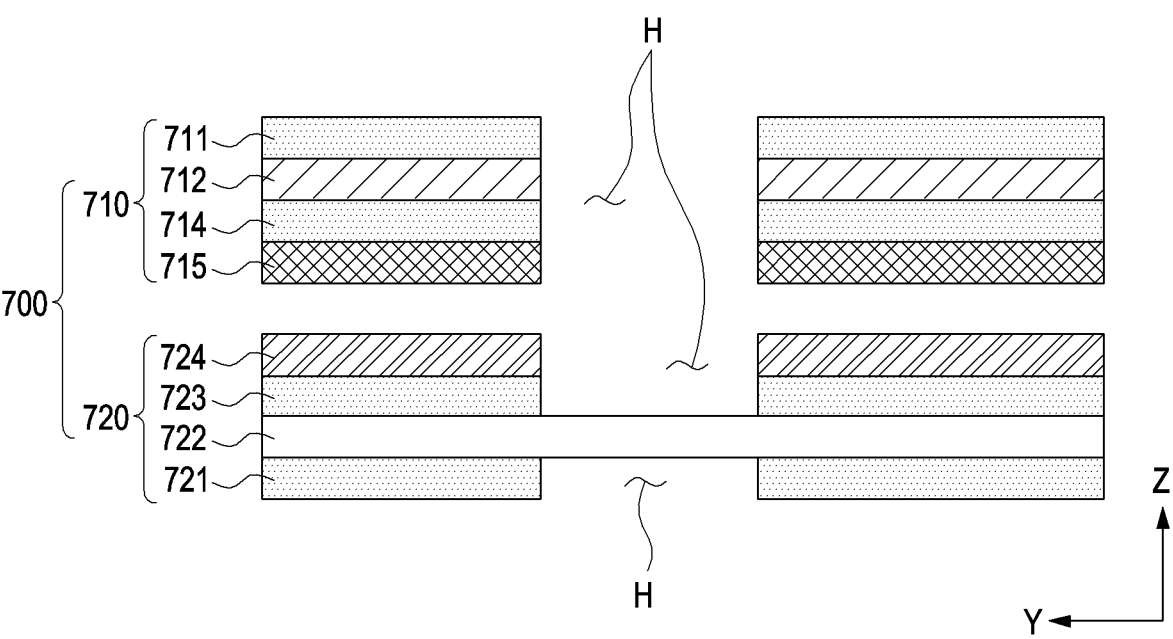
FIG. 13I is a diagram illustrating an enlarged cross-sectional view of a waterproof membrane assembly according to an embodiment.
Figure 13J:
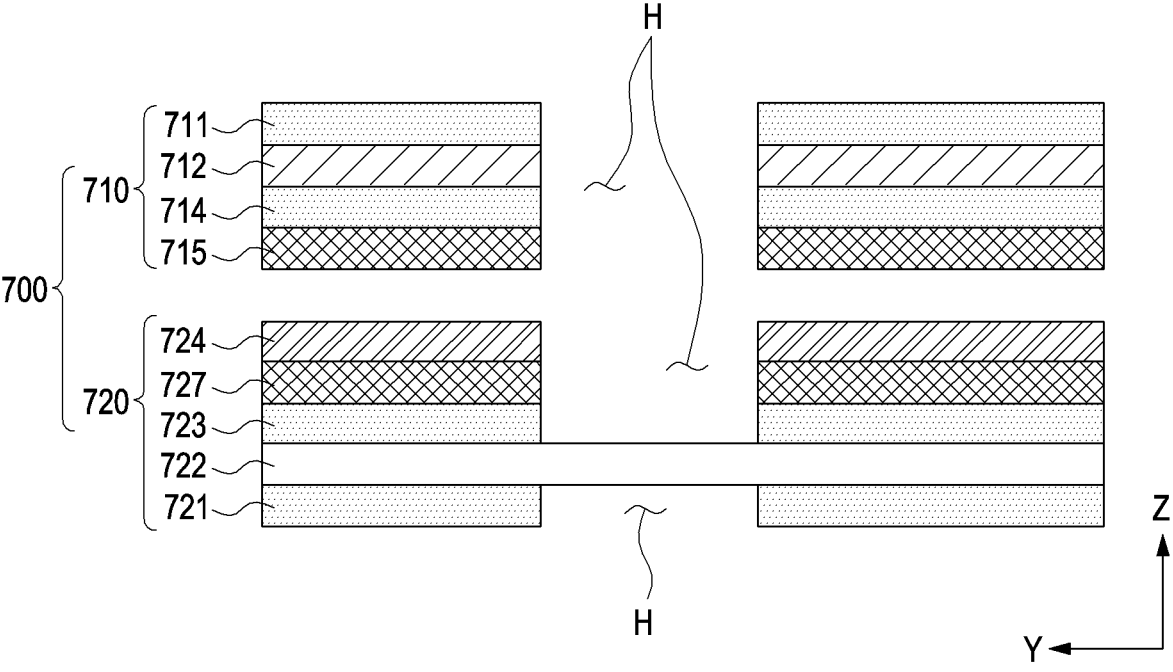
FIG. 13J is a diagram illustrating an enlarged cross-sectional view of a waterproof membrane assembly according to an embodiment.
Figure 13K:
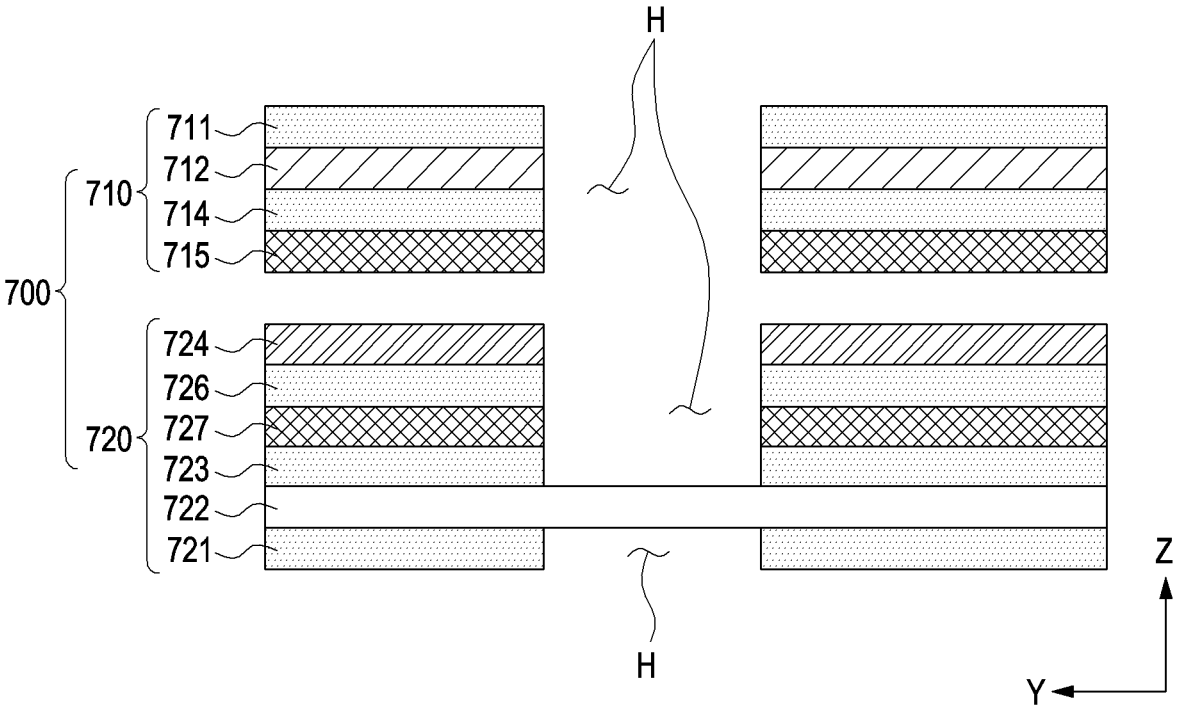
FIG. 13K is a diagram illustrating an enlarged cross-sectional view of a waterproof membrane assembly according to an embodiment.

FIG. 13A is a diagram illustrating a waterproof membrane assembly according to an embodiment. FIG. 13B is a diagram illustrating a waterproof membrane assembly according to an embodiment. FIG. 13C is a diagram illustrating a waterproof membrane assembly according to an embodiment. FIG. 13D is a diagram illustrating a waterproof membrane assembly according to an embodiment. FIG. 13E is a diagram illustrating a waterproof membrane assembly according to an embodiment. FIG. 13F is a diagram illustrating a waterproof membrane assembly according to an embodiment. FIG. 13G is a diagram illustrating a waterproof membrane assembly according to an embodiment. FIG. 13H is a diagram illustrating a waterproof membrane assembly according to an embodiment. FIG. 13I is a diagram illustrating a waterproof membrane assembly according to an embodiment. FIG. 13J is a diagram illustrating a waterproof membrane assembly according to an embodiment. FIG. 13K is a diagram illustrating a waterproof membrane assembly according to an embodiment.

Layers except for the membrane 722 may define a hole portion therein, where hole portions at a same side of the membrane 722 may together define a hole. An upper hole may be defined above the membrane 722 and be open in the Z-axis direction along a thickness direction. A lower hole may be defined below the membrane 722 and be open in the −Z-axis direction.

FIGS. 13A to 13E illustrate embodiments in which the second sub-assembly 720 includes the reinforcement member 725 exposed on a surface thereof prior to assembly of the first sub-assembly 710 and the second sub-assembly 720, as in the embodiment illustrated in FIG. 12B.

Referring to FIG. 13A, a waterproof membrane assembly according to an embodiment may include the first sub-assembly 710 including the first adhesive member 711 and the first elastic member 712 disposed sequentially in the −Z-axis direction, and the second sub-assembly 720 including the second adhesive member 721, the membrane 722, the third adhesive member 723, the second elastic member 724, a fourth adhesive member 726, and the reinforcement member 725 disposed sequentially in the +Z-axis direction.

FIG. 13B may disclose an embodiment in which the first sub-assembly 710 further includes a first substrate 713. The first substrate 713 may be configured to be located on the rear surface of the first elastic member 712 exposed on a surface of the first sub-assembly 710 and serve to support the first elastic member 712. As the first substrate 713 is provided, the compressive force of the first elastic member 712 may be adjusted. The first substrate 713 may be formed of the same material as the reinforcement member 725 or a material which is not the same as the reinforcement member 725. Referring to FIG. 13B, a waterproof membrane assembly according to an embodiment may include the first sub-assembly 710 including the first adhesive member 711, the first substrate 713, and the first elastic member 712 disposed sequentially in the −Z-axis direction, and the second sub-assembly 720 including the second adhesive member 721, the membrane 722, the third adhesive member 723, the second elastic member 724, and the reinforcement member 725 disposed sequentially in the +Z-axis direction.

Referring to FIG. 13C, a waterproof membrane assembly according to an embodiment may include the first sub-assembly 710 including the first adhesive member 711, the first substrate 713, and the first elastic member 712 disposed sequentially in the −Z-axis direction, and the second sub-assembly 720 including the second adhesive member 721, the membrane 722, the third adhesive member 723, the second elastic member 724, the fourth adhesive member 726, and the reinforcement member 725 disposed sequentially in the +Z-axis direction. FIG. 13D may disclose an embodiment in which the first sub-assembly 710 further includes a fifth adhesive member 714. Referring to FIG. 13D, a waterproof membrane assembly according to an embodiment may include the first sub-assembly 710 including the first adhesive member 711, the first substrate 713, the fifth adhesive member 714, and the first elastic member 712 disposed sequentially in the −Z-axis direction, and the second sub-assembly 720 including the second adhesive member 721, the membrane 722, the third adhesive member 723, the second elastic member 724, and the reinforcement member 725 disposed sequentially in the +Z-axis direction.

Referring to FIG. 13E, a waterproof membrane assembly according to an embodiment may include the first sub-assembly 710 including the first adhesive member 711, the first substrate 713, the fifth adhesive member 714, and the first elastic member 712 disposed sequentially in the −Z-axis direction, and the second sub-assembly 720 including the second adhesive member 721, the membrane 722, the third adhesive member 723, the second elastic member 724, the fourth adhesive member 726, and the reinforcement member 725 disposed sequentially in the +Z-axis direction.

FIGS. 13F to 13K illustrate embodiments in which, unlike the embodiment illustrated in FIG. 12B, the first sub-assembly 710 includes the reinforcement member 715 exposed on a surface thereof, prior to assembly of the first sub-assembly 710 and the second sub-assembly 720.

Referring to FIG. 13F, a waterproof membrane assembly according to an embodiment may include the first sub-assembly 710 including the first adhesive member 711, the first elastic member 712, and the reinforcement member 715 disposed sequentially in the −Z-axis direction, and the second sub-assembly 720 including the second adhesive member 721, the membrane 722, the third adhesive member 723, and the second elastic member 724 sequentially disposed in the +Z-axis direction. FIG. 13G may disclose an embodiment in which the second sub-assembly 720 further includes a second substrate 727. The second substrate 727 may be configured to be located on the rear surface of the second elastic member 724 exposed on a surface of the second sub-assembly 720 and serve to support the second elastic member 724. As the second substrate 727 is provided, the compressive force of the second elastic member 724 may be adjusted. The second substrate 727 may be formed of the same material as the reinforcement member 715 or a material which is not the same as the reinforcement member 715.

Referring to FIG. 13G, a waterproof membrane assembly according to an embodiment may include the first sub-assembly 710 including the first adhesive member 711, the first elastic member 712, and the reinforcement member 715 disposed sequentially in the −Z-axis direction, and the second sub-assembly 720 including the second adhesive member 721, the membrane 722, the third adhesive member 723, the second substrate 727, and the second elastic member 724 disposed sequentially in the +Z-axis direction.

FIG. 13H may disclose an embodiment in which the second sub-assembly 720 further includes a fourth adhesive member 726. Referring to FIG. 13H, a waterproof membrane assembly according to an embodiment may include the first sub-assembly 710 including the first adhesive member 711, the first clastic member 712, and the reinforcement member 715 disposed sequentially in the −Z-axis direction, and the second sub-assembly 720 including the second adhesive member 721, the membrane 722, the third adhesive member 723, the second substrate 727, the fourth adhesive member 726, and the second elastic member 724 disposed sequentially in the +Z-axis direction.

FIG. 13I may disclose an embodiment in which the first sub-assembly 710 further includes a fifth adhesive member 714. Referring to FIG. 13I, a waterproof membrane assembly according to an embodiment may include the first sub-assembly 710 including the first adhesive member 711, the first elastic member 712, the fifth adhesive member 714, and the reinforcement member 715 disposed sequentially in the −Z-axis direction, and the second sub-assembly 720 including the second adhesive member 721, the membrane 722, the third adhesive member 723, and the second elastic member 724 disposed sequentially in the +Z-axis direction.

Referring to FIG. 13J, a waterproof membrane assembly according to an embodiment may include the first sub-assembly 710 including the first adhesive member 711, the first elastic member 712, the fifth adhesive member 714, and the reinforcement member 715 disposed sequentially in the −Z-axis direction, and the second sub-assembly 720 including the second adhesive member 721, the membrane 722, the third adhesive member 723, the second substrate 727, and the second clastic member 724 disposed sequentially in the +Z-axis direction.

Referring to FIG. 13K, a waterproof membrane assembly according to an embodiment may include the first sub-assembly 710 including the first adhesive member 711, the first elastic member 712, the fifth adhesive member 714, and the reinforcement member 715 disposed sequentially in the −Z-axis direction, and the second sub-assembly 720 including the second adhesive member 721, the membrane 722, the third adhesive member 723, the second substrate 727, the fourth adhesive member 726, and the second clastic member 724 disposed sequentially in the +Z-axis direction.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements.

It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases.

As used herein, such terms as "1st" and "2nd", or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

It will be understood that when an element is referred to as being related to another element such as being "on" another element, it can be directly on the other element or intervening elements may be present therebetween. In contrast, when an element is referred to as being related to another element such as being "directly on" another element, there may be no intervening elements present. Elements being in contact or being "directly" related to each other, may form an interface therebetween.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

According to an embodiment of the disclosure, the electronic device 101 may include the plate 302 surrounding at least a portion of an internal space of the electronic device, the PCB 330, the electronic component 351 disposed on the first surface 330a of the PCB 330, the sealing member 710 disposed on the second surface 330b of the PCB 330, and the waterproof member 720 disposed on the inner surface of the plate forming the internal space and configured to contact the sealing member.

That is, the electronic device may include a plate including an inner surface exposed to an internal space of the electronic device, a circuit board facing the inner surface of the plate, the circuit board including a first surface and a second surface which is opposite to the first surface of the circuit board and faces the inner surface of the plate, an electronic component on the first surface of the circuit board, a sealing member on the second surface of the circuit board, and a waterproof member which is disposed on the inner surface of the plate and is configured to be assembled with the sealing member. The sealing member assembled with the waterproof member includes the sealing member in contact with the waterproof member.

According to an embodiment, one of the sealing member 710 and the waterproof member 720 may further include a reinforcement member exposed on a surface of the one of the sealing member (710) and the waterproof member (720), where the reinforcement member is configured to be exposed before the sealing member (710) and the waterproof member (720) are assembled.

According to an embodiment, the other of the sealing member 710 and the waterproofing member 720 may have an elastic member with relatively low hardness exposed on a surface of the other of the sealing member (710) and the waterproof member (720), where the clastic member is configured to be exposed before the first sub-assembly (710) and the second sub-assembly (720) are assembled.

The sealing member assembled with the waterproof member may further include an outer surface of the sealing member in contact with an outer surface of the waterproof member, and the outer surface of one of the sealing member and the waterproof member may be defined by a reinforcement layer. The outer surface of the other of the sealing member and the waterproofing member may be defined by an elastic member, and a hardness of the outer surface of the other of the sealing member and the waterproofing member may be lower than a hardness of the outer surface of the one of the sealing member and the waterproof member. For example, The sealing member un-assembled with the waterproof member may include an outer surface of the sealing member which faces an outer surface of the waterproof member, the outer surface of one of the sealing member and the waterproof member may be defined by a reinforcement layer having a first hardness, and the outer surface of the other of the sealing member and the waterproof member may be defined by an elastic layer having a second hardness which is smaller than the first hardness.

According to an embodiment, the electronic component may be a microphone.

According to an embodiment, the inner surface of the plate may define a recess of the plate, which is open to the circuit board, and the waterproof member may be in the recess of the plate.

According to an embodiment, the plate may include the first surface 302c facing in the first direction (−Z direction), the second surface 302d facing in the second direction (+Z direction) opposite to the first direction, and the third surface 302e facing in the third direction (Y direction) different from the first direction and the second direction.

According to an embodiment, the PCB may be configured to be disposed facing the second surface 302d of the plate, and the waterproof member may be disposed on the seating surface 302h formed on the second surface of the plate.

According to an embodiment, the sealing member 710 may include the first adhesive member 711 and the first elastic member 712, and the waterproof member 720 may include the second adhesive member 721, the membrane 722, the third adhesive member 723, and the second elastic member 724.

According to an embodiment, the outer surface of the waterproof member may be defined as the reinforcement member, and the first elastic member of the sealing member defines the elastic layer. Conversely, according to an embodiment, the outer surface of the sealing member may be defined as the reinforcement member, and the second elastic member of the waterproof member defines the elastic layer.

According to an embodiment, the waterproof member 720 may further include the reinforcement member 725.

According to an embodiment, the waterproof member 720 may further include the fourth adhesive member 726 between the second elastic member 724 and the reinforcement member 725.

According to an embodiment, the sealing member 710 may further include the first substrate 713 between the first adhesive member 711 and the first elastic member 712.

According to an embodiment, the sealing member 710 may further include the fifth adhesive member 714 between the first substrate 713 and the first elastic member 712.

According to an embodiment, the sealing member 710 may further include the reinforcement member 715.

According to an embodiment, the waterproof member 720 may further include the second substrate 727 between the third adhesive member 723 and the second elastic member 724.

According to an embodiment, the waterproof member 720 may further include the fourth adhesive member 726 between the second substrate 727 and the second elastic member 724.

According to an embodiment, the sealing member 710 may further include the fifth adhesive member 714 between the reinforcement member 715 and the first elastic member 712.

According to an embodiment of the disclosure, the electronic device 101 may include the plate 302 including the first surface 302c facing in the first direction (−Z direction), a second surface 302d facing in the second direction (+Z direction) opposite to the first direction, and the third surface 302e facing in the third direction (Y direction) different from the first direction and the second direction, the PCB 330 configured to be disposed facing the second surface 302d of the plate, the audio module 351 disposed on the first surface 330a of the PCB 330, the sealing member 710 disposed on the second surface 330b of the PCB 330, and the waterproof member 720 disposed on the seating surface 302h formed on the second surface of the plate, and configured to contact the sealing member. The sealing member 710 and the waterproof member 720 may be configured to be at least partially accommodated in the recess R formed by the seating surface and the PCB 330.

That is, the electronic device may include a plate including an inner surface which is exposed to an internal space of the electronic device and in which a recess of the plate is defined, a circuit board facing the inner surface of the plate, the circuit board including a first surface and a second surface which is opposite to the first surface of the circuit board and faces the recess of the plate, an audio module on the first surface of the circuit board, a sealing member on the second surface of the circuit board, and a waterproof member which is on the inner surface of the plate and is configured to be assembled with the sealing member. The electronic device includes the sealing member and the waterproof member partially accommodated in the recess of the plate.

According to an embodiment, the sealing member 710 may include a first adhesive member and a first elastic member, and the waterproof member 720 may include a second adhesive member, a second elastic member, and a membrane.

According to an embodiment, one of the sealing member 710 and the waterproofing member 720 may further include a reinforcement member exposed on a surface of the one of the sealing member (710) and the waterproof member (720), where the reinforcement member is configured to be exposed before the sealing member (710) and the waterproof member (720) are assembled.

According to an embodiment of the disclosure, the electronic device 101 may include the plate 302 including the first surface 302c facing in the first direction (−Z direction), the second surface 302d facing in the second direction (+Z direction) opposite to the first direction, and the third surface 302e facing in the third direction (Y direction) different from the first direction and the second direction, the PCB 330 configured to be disposed facing the second surface 302d of the plate, the audio module 351 disposed on the first surface 330a of the PCB 330, and the waterproof membrane assembly 700 configured to be at least partially accommodated in the recess R formed on the plate. The waterproof membrane assembly may include the first sub-assembly 710 disposed on the second surface 330*b* of the PCB and including a first adhesive member and a first elastic member, the second sub-assembly 720 disposed on the seating surface 302*h* formed on the second surface 302*d* of the plate and including a second adhesive member, a second elastic member, and a membrane, and a reinforcement member exposed on a surface of one of the first sub-assembly and the second sub-assembly.

That is, the electronic device may include a plate including an inner surface which is exposed to an internal space of the electronic device and in which a recess of the plate is defined, a circuit board facing the inner surface of the plate, the circuit board including a first surface and a second surface which is opposite to the first surface of the circuit board and faces the recess of the plate, an audio module on the first surface of the circuit board, and a waterproof membrane assembly partially accommodated in the recess of the plate. The waterproof membrane assembly may include a first sub-assembly on the second surface of the circuit board, the first sub-assembly including a first adhesive member and a first elastic member, and a second sub-assembly which is in the recess of the plate and configured to be assembled with the first sub-assembly, the second sub-assembly including a second adhesive member, a second elastic member, and a waterproof breathable membrane. The first sub-assembly un-assembled with the second sub-assembly includes an outer surface of the first sub-assembly which faces an outer surface of the second sub-assembly. The outer surface of one of the first sub-assembly and the second sub-assembly may be defined by a reinforcement member.

According to an embodiment, one of the first sub-assembly 710 and the second sub-assembly 720 may be configured to have a reinforcement member exposed on a surface thereof, and the other may be configured to have an elastic member with lower hardness than the reinforcement member, exposed on a surface thereof, before the first sub-assembly 710 and the second sub-assembly 720 are assembled.

While specific embodiments have been described in the detailed description of various embodiments of the disclosure, it will be apparent to those skilled in the art that many modifications can be made without departing from the subject matter of the disclosure.

What is claimed is:

1. An electronic device comprising:
   a plate comprising an inner surface exposed to an internal space of the electronic device;
   a circuit board facing the inner surface of the plate, the circuit board comprising a first surface and a second surface which is opposite to the first surface and faces the inner surface of the plate;
   an electronic component on the first surface of the circuit board;
   a sealing member on the second surface of the circuit board; and
   a waterproof member which is on the inner surface of the plate and is configured to be assembled with the sealing member,
   wherein the sealing member assembled with the waterproof member includes the sealing member in contact with the waterproof member.

2. The electronic device of claim 1, wherein
   the sealing member which is assembled with the waterproof member further includes an outer surface of the sealing member in contact with an outer surface of the waterproof member, and
   the outer surface of one of the sealing member and the waterproof member is defined by a reinforcement layer.

3. The electronic device of claim 2, wherein
   the outer surface of the other of the sealing member and the waterproofing member is defined by an elastic layer, and
   a hardness of the outer surface of the other of the sealing member and the waterproofing member is lower than a hardness of the outer surface of the one of the sealing member and the waterproof member.

4. The electronic device of claim 1, wherein the electronic component is a microphone.

5. The electronic device of claim 1, wherein
   the inner surface of the plate defines a recess of the plate, which is open to the circuit board, and
   the waterproof member is in the recess of the plate.

6. The electronic device of claim 1, wherein
   the sealing member which is un-assembled with the waterproof member includes an outer surface of the sealing member which faces an outer surface of the waterproof member,
   the outer surface of one of the sealing member and the waterproof member is defined by a reinforcement layer having a first hardness, and
   the outer surface of the other of the sealing member and the waterproof member is defined by an elastic layer having a second hardness which is smaller than the first hardness.

7. The electronic device of claim 6, wherein
   the sealing member further includes a first adhesive member and a first elastic member, and
   the waterproof member further includes a second adhesive member, a waterproof breathable membrane, a third adhesive member, and a second elastic member.

8. The electronic device of claim 7, wherein
   the outer surface of the waterproof member is defined as the reinforcement layer, and
   the first elastic member of the sealing member is defined as the elastic layer.

9. The electronic device of claim 8, wherein the waterproof member further includes a fourth adhesive member between the second elastic member and the reinforcement member.

10. The electronic device of claim 9, wherein the sealing member further includes a first substrate between the first adhesive member and the first elastic member.

11. The electronic device of claim 10, wherein the sealing member further includes a fifth adhesive member between the first substrate and the first elastic member.

12. The electronic device of claim 7, wherein
   the outer surface of the sealing member is defined as the reinforcement layer, and
   the second elastic member of the waterproof member defines the elastic layer.

13. The electronic device of claim 12, wherein the waterproof member further includes a second substrate between the third adhesive member and the second elastic member.

14. The electronic device of claim 13, wherein the waterproof member further includes a fourth adhesive member between the second substrate and the second elastic member.

15. The electronic device of claim 14, wherein the sealing member further includes a fifth adhesive member between the reinforcement member and the first elastic member.

16. An electronic device comprising:

a plate comprising an inner surface which is exposed to an internal space of the electronic device and in which a recess of the plate is defined;

a circuit board facing the inner surface of the plate, the circuit board comprising a first surface and a second surface which is opposite to the first surface of the circuit board and faces the recess of the plate;

an audio module on the first surface of the circuit board;

a sealing member on the second surface of the circuit board; and a waterproof member which is on the inner surface of the plate and is configured to be assembled with the sealing member, wherein the sealing member which is assembled with the waterproof member includes the sealing member and the waterproof member partially accommodated in the recess of the plate.

17. The electronic device of claim 16, wherein the sealing member includes a first adhesive member and a first elastic member, and the waterproof member includes a second adhesive member, a second elastic member, and a waterproof breathable membrane.

18. The electronic device of claim 17, wherein the outer surface of the waterproof member is defined as the reinforcement layer, and the first elastic member of the sealing member defines the elastic layer.

19. The electronic device of claim 16, wherein the outer surface of the sealing member is defined as the reinforcement layer, and the second elastic member of the waterproof member defines the elastic layer.

20. An electronic device comprising:

a plate comprising an inner surface which is exposed to an internal space of the electronic device and in which a recess of the plate is defined;

a circuit board facing the inner surface of the plate, the circuit board comprising a first surface and a second surface which is opposite to the first surface of the circuit board and faces the recess of the plate;

an audio module on the first surface of the circuit board; and a waterproof membrane assembly partially accommodated in the recess of the plate, wherein the waterproof membrane assembly includes:

a first sub-assembly on the second surface of the circuit board, the first sub-assembly including a first adhesive member and a first elastic member; and a second sub-assembly which is in the recess of the plate and configured to be assembled with the first sub-assembly, the second sub-assembly including a second adhesive member, a second elastic member, and a waterproof breathable membrane, and wherein the first sub-assembly which is un-assembled with the second sub-assembly includes an outer surface of the first sub-assembly which faces an outer surface of the second sub-assembly, and the outer surface of one of the first sub-assembly and the second sub-assembly is defined by a reinforcement layer.

* * * * *